US012745476B2

(12) United States Patent
Shih et al.

(10) Patent No.: US 12,745,476 B2
(45) Date of Patent: Sep. 22, 2026

(54) DEEP TRENCH ISOLATION STRUCTURE FOR HIGH RESOLUTION CIS PIXEL

(71) Applicant: Taiwan Semiconductor Manufacturing Company, Ltd., Hsinchu (TW)

(72) Inventors: Chih Cheng Shih, Kaohsiung City (TW); Tsun-Kai Tsao, Tainan City (TW); Jiech-Fun Lu, Madou Township (TW); Hung-Wen Hsu, Tainan City (TW); Bing Cheng You, Taichung City (TW); Wen-Chang Kuo, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 796 days.

(21) Appl. No.: 18/149,240

(22) Filed: Jan. 3, 2023

(65) Prior Publication Data

US 2024/0088187 A1 Mar. 14, 2024

Related U.S. Application Data

(60) Provisional application No. 63/405,531, filed on Sep. 12, 2022.

(51) Int. Cl.
*H10F 39/18* (2025.01)
*H10F 39/00* (2025.01)

(52) U.S. Cl.
CPC ......... *H10F 39/807* (2025.01); *H10F 39/014* (2025.01); *H10F 39/18* (2025.01)

(58) Field of Classification Search
CPC ....... H10F 39/807; H10F 39/014; H10F 39/18
See application file for complete search history.

(56) References Cited

U.S. PATENT DOCUMENTS

| | | | | |
|---|---|---|---|---|
| 4,793,897 | A * | 12/1988 | Dunfield | H01L 21/3065 257/E21.252 |
| 5,919,311 | A * | 7/1999 | Shive | H01L 21/02052 438/746 |
| 7,855,150 | B2 | 12/2010 | Laermer et al. | |
| 10,957,514 | B2 * | 3/2021 | Singhal | C23C 16/5096 |
| 2017/0062496 | A1 * | 3/2017 | Lai | H10F 39/807 |
| 2022/0028989 | A1 * | 1/2022 | Lee | H10D 64/256 |
| 2023/0377885 | A1 * | 11/2023 | Shih | H01L 21/02016 |

FOREIGN PATENT DOCUMENTS

| | | | | |
|---|---|---|---|---|
| CN | 110943033 | A * | 3/2020 | H10B 12/01 |

* cited by examiner

*Primary Examiner* — Marlon T Fletcher
*Assistant Examiner* — Mehek Ahmed
(74) *Attorney, Agent, or Firm* — Eschweiler & Potashnik, LLC

(57) ABSTRACT

Trenches in which to form a back side isolation structure for an array of CMOS image sensors are formed by a cyclic process that allows the trenches to be kept narrow. Each cycle of the process includes etching to add a depth segment to the trenches and coating the depth segment with an etch-resistant coating. The following etch step will break through the etch-resistant coating at the bottom of the trench but the etch-resistant coating will remain in the upper part of the trench to limit lateral etching and substrate damage. The resulting trenches have a series of vertically spaced nodes. The process may result in a 10% increase in photodiode area and a 30-40% increase in full well capacity.

20 Claims, 27 Drawing Sheets

DEEP TRENCH ISOLATION STRUCTURE FOR HIGH RESOLUTION CIS PIXEL

REFERENCE TO RELATED APPLICATION

This Application claims the benefit of U.S. Provisional Application No. 63/405,531, filed on Sep. 12, 2022, the contents of which are hereby incorporated by reference in their entirety.

BACKGROUND

Integrated circuits (IC) with image sensors are used in a wide range of modern-day electronic devices such as cameras and cell phones. Complementary metal-oxide semiconductor (CMOS) devices have become popular IC image sensors. Compared to charge-coupled devices (CCD), CMOS image sensors (CIS) are increasingly favored due to low power consumption, small size, fast data processing, a direct output of data, and low manufacturing cost. As IC's shrink in size, CIS pixels also become smaller. With smaller pixel sizes, cross-talk becomes a greater concern. There has been a long felt need to make CIS pixels smaller while maintaining sensitivity and reducing cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
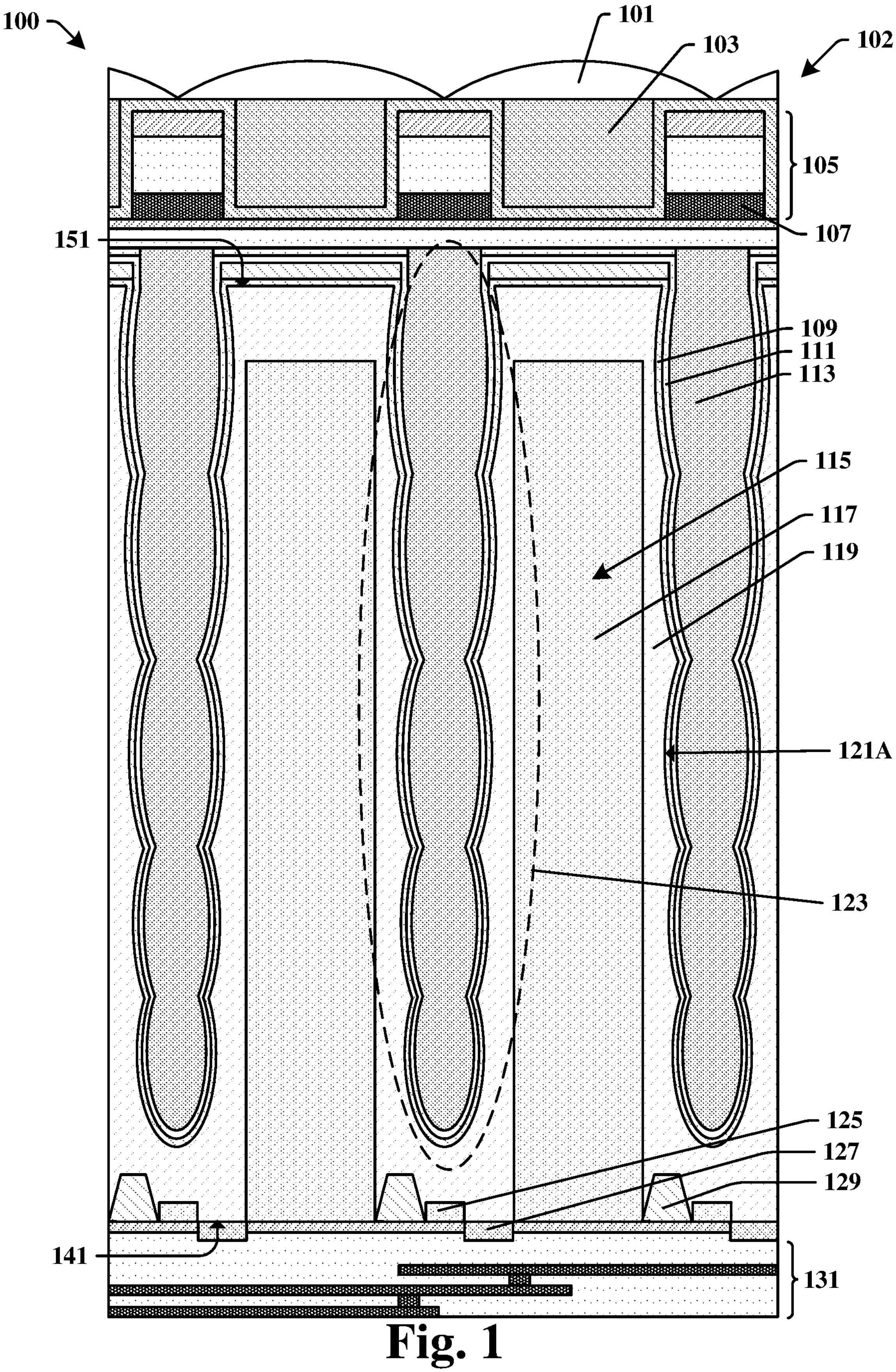
FIG. 1 illustrates a cross-sectional side view on a photodetector pixel array in an IC device according to some embodiments of the present disclosure.

The following disclosure provides many different embodiments, or examples, for implementing different features of the subject matter. Specific examples of components and arrangements are described to simplify the disclosure. These are, of course, merely examples and are not limiting. For example, the formation of a first feature over or on a second feature in the description that follows may include embodiments in which the first and second features are formed in direct contact and may also include embodiments in which additional features are formed between the first and second features so that that the first and second features are not in direct contact. In addition, the present disclosure may repeat reference numerals and/or letters in various examples. This repetition is for the purpose of simplicity and clarity and does not in itself dictate a relationship between the various embodiments and/or configurations exemplified.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a semiconductor substrate with an array of photodetector regions and a back side isolation structure arranged within the semiconductor substrate. The back side isolation structure forms a grid of intersecting segments. Each grid segment provides isolation between a pair of laterally adjacent photodiodes to limit cross-talk between corresponding photodetector pixels. As the pitch of the grid becomes finer, the area occupied by back side isolation structure has a progressively greater impact on the area available for the photodetectors.

One aspect of the present disclosure is a method of forming a back side isolation structure that allows the grid segments to be made narrower. Forming the back side isolation structure includes etching a grid of deep trenches in the back side of the semiconductor substrate. The method focuses on the process of forming those deep trenches. According to the method, the trenches are formed in a cyclic process. Each cycle includes etching to increase trench depth and then lining with an etch-resistant coating before beginning the next cycle. The following etch step will break through the etch-resistant coating at the bottoms of the trenches. The etch-resistant coating remains in the upper parts of the trenches to limit lateral etching and substrate damage. After etching, the etch-resistant coating may be stripped.

As a result of this process, the trenches form in a series of depth segments. Each new depth segment begins at a point where etching breaks through the etch-resistant coating at the bottom of the previous depth segment. The depth segments become narrower at their bottoms due to such effects as exposure time being longer at the top and etchants becoming less concentrated toward the bottom. Narrowing at the bottoms results in so-called "turning nodes" at the junctures between depth segments. A turning node is an area in which a vertical profile of the trench transitions from a first zone in which the trench profile is becoming narrower and shallower with increasing depth to a second zone in which the trench profile is becoming steeper or has a width that remains constant with increasing depth. The trench is narrowing through the first zone. In some embodiments, the trench sidewall becomes vertical in the second zone. In some embodiments, the trench begins to widen in the second zone. If the trench widens in the second zone and there is a turning node beneath at which the trench begins to narrow again, the depth segment between the two turning nodes will have a bulge. Accordingly, the trench may have a series of bulges corresponding to depth segments.

In some embodiments, etching is plasma etching. The plasma breaks through the etch-resistant coating at the bottom of the trench while the coating remains largely intact on the sides of the trench. In some embodiments, the power is relatively low. The power is high enough that the plasma mainly increases the depth of the trench but may be low enough to allow some lateral etching in the newly forming segment. In some embodiments, the power is low enough that the trench widens below each turning node. In some embodiments, the pressure is kept relatively low. Low pressure facilitates creating steep sidewalls and limiting crossroad loading. Crossroad loading refers to the tendency of the trench to be deeper at the intersection of grid segments.

The method of the present disclosure allows the isolation grid to be made narrower in comparison to the product of a single uninterrupted etch cycle. In some embodiments, the isolation grid is made narrower by at least about 10%. In some embodiments, the isolation grid is made narrower by about 20 nm or more. For an 0.6 μm photodetector pixel spacing (pitch), this provides only about a 10% increase in photodetector area. The effect on full well capacity, however, is more substantial. The full well capacity increases by 30-40%. Full well capacity is the amount of charge a photodetector pixel can hold before saturating. The more than linear increase in full well capacity may result from a doping profile of a photodiodes. The doping profile of a photodiode includes a PN junction of relatively fixed width. Just as a fixed isolation grid width may have a greater than linear impact on available area with diminishing photodetector pixel pitch, the relatively fixed PN junction width has a more than linear impact.

The reduction in segment width does not limit the type of isolation grid. In some embodiments, the isolation grid is a dielectric structure. In some embodiments, the isolation grid includes an in substrate metal grid and a dielectric liner that separates the in substrate metal grid from the adjacent semiconductor substrate. In some embodiments, the dielectric liner comprises two dielectric layers. The in substrate metal grid may be provided with an electrical bias. The bias may be adjusted to achieve a balance between reducing crosstalk and increasing quantum efficiency.

FIG. 1 illustrates an IC device 100 according to the present disclosure. The IC device 100 includes an array of photodetector regions 115 that may comprise photodiodes 117 within a semiconductor substrate 119. The photodetector regions are separated by an isolation structure 123 that is formed by a method of the present disclosure within a back side 151 of the semiconductor substrate 119. Micro-lenses 101 on the back side 151 may direct light through color filters 103 and into the photodiodes 117. A composite grid 105 including a back side metal grid 107 may assist in directing light into the photodiodes 117 and separating incident light between adjacent photodetector regions 115. A metal interconnect 131 may also be disposed on a front side 141 of the semiconductor substrate 119.

The photodiodes 117 are parts of photodetector regions 115. The photodetector regions 115 form a CMOS image sensor 102. The photodetector regions 115 may be any type of semiconductor-based photodetector and may include transfer gates 127, floating diffusion regions 125, and/or other structures formed on the front side 141. In some embodiments, the photodiodes 117 are pinned photodiodes. In some embodiments, the photodetector regions 115 are active-pixel sensors.

The isolation structure 123 electrically isolates photodiodes 117 so as to limit crosstalk between adjacent photodetector regions 115. The isolation structure 123 may include a first dielectric layer 109, a second dielectric layer 111, and an in-substrate metal grid 113. The isolation structure 123 has a vertical profile 121A that has a distinctive shape. This distinctive shape is the product of a process of forming the isolation structure 123 in a manner that allows the isolation structure 123 to remain narrow and thereby leave more area for the photodiodes 117.

Figure 2:
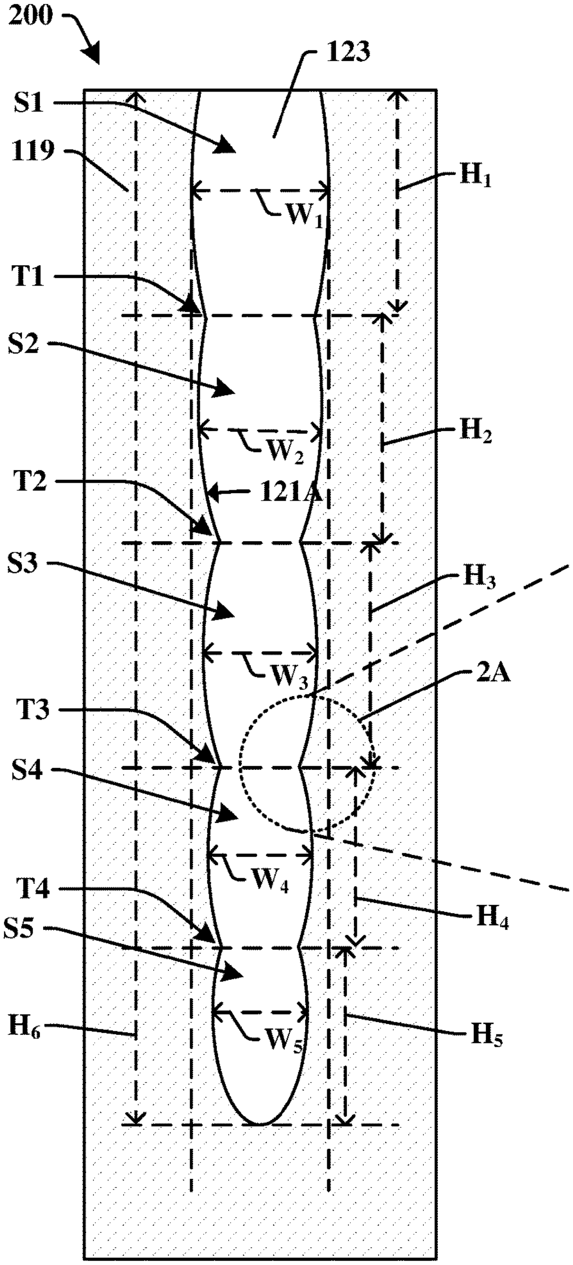
FIG. 2 illustrates a vertical profile of the isolation structure of FIG. 1 in accordance with some embodiments.

FIG. 2 provides a cross-sectional view 200 that highlights certain features of the vertical profile 121A. The vertical profile 121A includes depth segments S1-S5. In some embodiments, there are 2 to 20 of these depth segments. In some embodiments, there are 3 to 10 depth segments. In some embodiments, there are 4 to 6 depth segments. In this example, there are five depth segments S1-S5.

The depth segments S1-S5 have heights $H_1$-$H_5$ respectively. In some embodiments, higher depth segments S1-S4 have greater heights than lower depth segments S2-S5. In some embodiments, $H_1>H_2>H_3>H_4>H_5$. However, this ordering may be varied. In some embodiments, the tallest of the depth segments S1-S5 is at least 50% taller than the shortest. In some embodiments, the tallest of the depth segments S1-S5 is at least twice as tall than the shortest.

The isolation structure 123 has an overall height $H_6$. In some embodiments, the height $H_6$ is in the range from about 500 nm to about 5000 nm. In some embodiments, the height $H_6$ is in the range from about 1000 nm to about 3000 nm. In some embodiments, the height $H_6$ is in the range from about 1500 nm to about 2500 nm, e.g., about 2000 nm. If the height is either too large or too small, the photodetector regions 115 may not work efficiently. In some embodiments, the largest of the heights $H_1$-$H_5$ is from 10% to 75% of $H_6$. In some embodiments, the largest of the heights $H_1$-$H_5$ is from 25% to 50% of $H_6$. In some embodiments, the depth segment S1 is the tallest of the depth segments S1-S5. Having the depth segment S1 occupy a substantial portion of the overall height of $H_6$ is associated with an efficient process. If the depth segment S1 is too tall, it may be difficult to provide the vertical profile 121A with a desired shape.

The depth segments S1-S5 have maximum widths $W_1$-$W_5$ respectively. In some embodiments, higher depth segments S1-S4 have greater widths than lower depth segments S2-S5. In some embodiments, $W_1>W_2>W_3>W_4>W_5$. However, this ordering need not be strictly maintained. In some embodiments, the widest of the depth segments S1-S5 is from about 25% to about 200% wider than the narrowest. In some embodiments, the widest of the depth segments S1-S5 is from about 50% to about 100% wider than the narrowest. An efficient process allows the lower depth segments S2-S5 to be narrower but if some of the depth segments S1-S5 become too narrow it may be difficult to form an operative portion of the isolation structure 123 within them.

In some embodiments, the largest of the widths $W_1$-$W_5$ of the depth segments S1-S5 is the range from about 50 nm to about 300 nm. In some embodiments, the largest of the widths $W_1$-$W_5$ is the range from about 100 nm to about 200 nm, e.g., about 145 nm. If some of the depth segments S1-S5 are too wide, the area occupied by the isolation structure 123 may not be effectively controlled.

An aspect ratio of the isolation structure 123 may be defined as a ratio between the largest of the widths $W_1$-$W_5$ and the overall height $H_6$. In some embodiments, the aspect ratio is in the range from about 1:10 to about 1:50. In some embodiments, the aspect ratio is in the range from about 1:13 to about 1:20. The method of the present disclosure is particularly useful when the aspect ratio is high. If the aspect ratio is too high, it may be difficult to form the isolation structure 123.

Figure 2A:
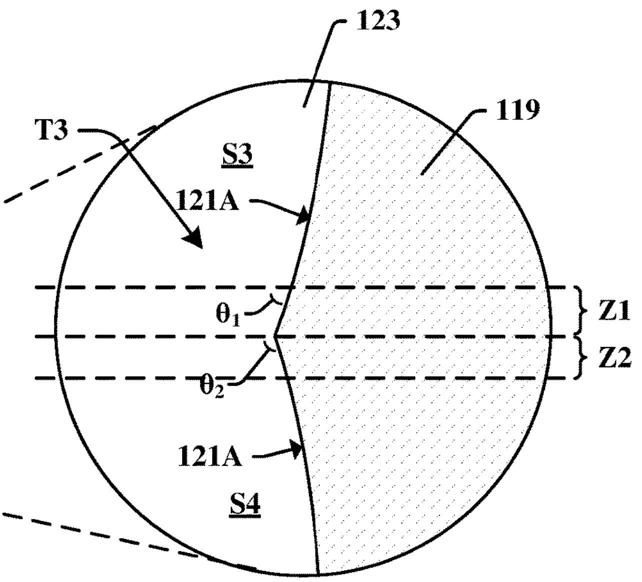
FIG. 2A provides an expanded view of a portion of FIG. 2.

Turning nodes T1-T4 occur at junctures of adjacent depth segments S1-S5. FIG. 2A provides an expanded view of an area 2A in FIG. 2 that include the turning node T3. The turning node T3 occurs at the juncture of the depth segment S3 and the depth segment S4. The following description focuses on the turning node T3 but applies to all the turning nodes T1-T4. The turning node T3 includes a first zone Z1 that is within the depth segment S3 and a second zone Z2 that is within the depth segment S4.

Within the zone Z1 the vertical profile 121A is narrowing. Within the zone Z1 there is a point at which the rate of narrowing reaches a maximum. At that point, the vertical profile 121A make the angle $\theta_1$ with respect to horizontal. The angle $\theta_1$ is less than 90 degrees. In some embodiments, the angle $\theta_1$ is about 75 degrees or less. In some embodiments, the angle $\theta_1$ is about 60 degrees or less.

The vertical profile 121A is steeper in the zone Z2. In some embodiments, the vertical profile 121A becomes straight up and down within the zone Z2. In some embodiments, the vertical profile 121A becomes wider within the zone Z2. There is a point within Z2 at which a rate of widening is at a maximum. At that point, the vertical profile 121A make the angle $\theta_2$ with respect to horizontal. In some embodiments, the angle $\theta_2$ is greater than 90 degrees. In some embodiments, the angle $\theta_2$ is about 105 degrees or more. In some embodiments, the angle $\theta_2$ is about 120 degrees or more. In some embodiments, the total bend of the vertical profile 121A through the turning node T3, as measure by the angle $\theta_2$ minus the angle $\theta_1$, is from about 10 degrees to about 120 degrees. In some embodiments, the total bend is from about 30 degrees to about 90 degrees. These angles are related to a process that limits a width of the isolation structure 123 and may be controlled through adjustments to those processing conditions.

Figure 3:
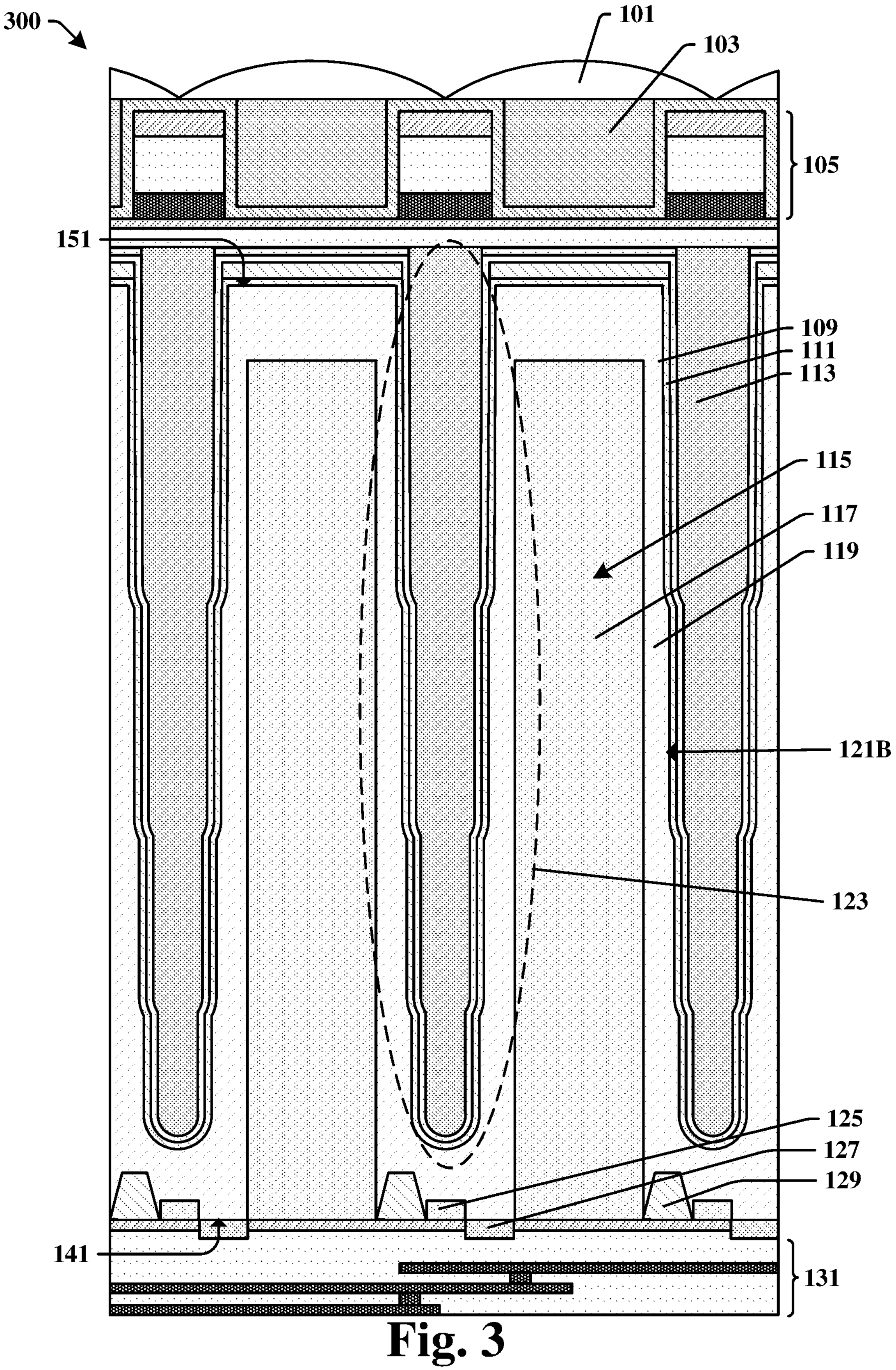
FIG. 3 illustrates a cross-sectional side view on a photodetector pixel array in an IC device according to some other embodiments of the present disclosure.
Figure 4:
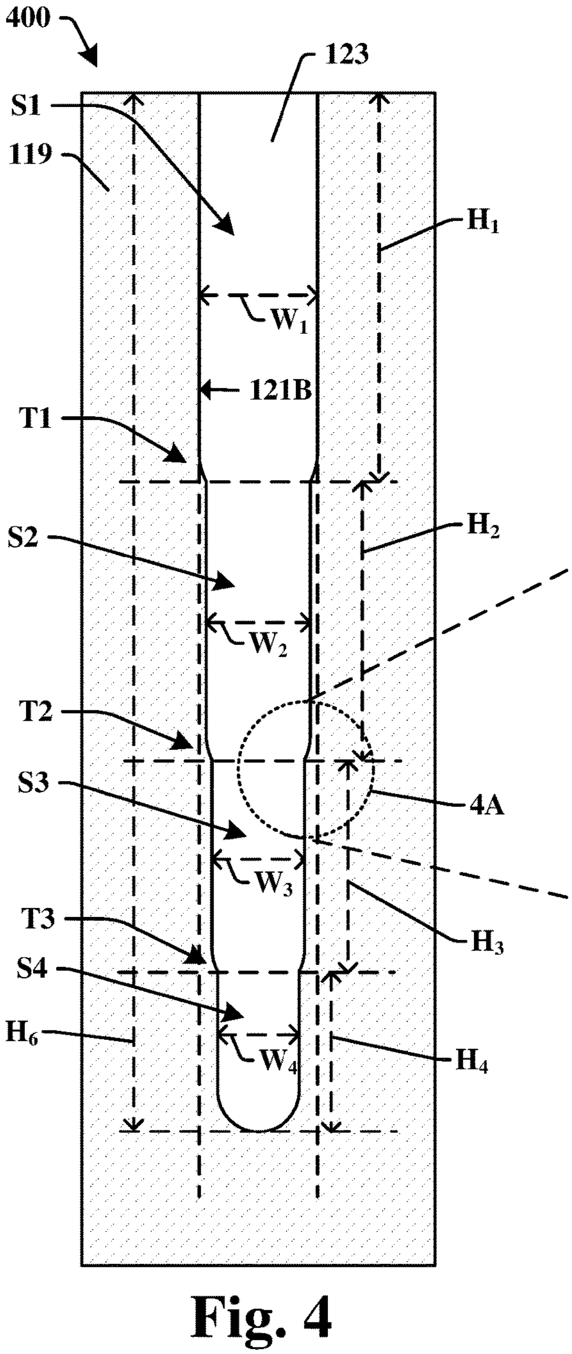
FIG. 4 illustrates a vertical profile of the isolation structure of FIG. 3 in accordance with some embodiments.
Figure 4A:
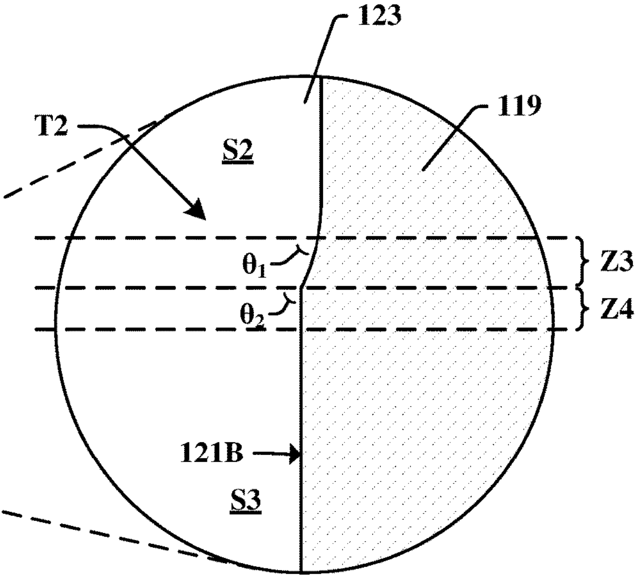
FIG. 4A provides an expanded view of a portion of FIG. 4.

FIG. 3 illustrates an IC device 300 that is like the IC device 100 except that in the IC device 300 the isolation structure 123 has the vertical profile 121B. FIG. 4 provides a cross-sectional view 400 that highlights features of the vertical profile 121B. The vertical profile 121B includes four depth segments S1-S4 and three turning nodes T1-T3. FIG. 4A provides an expanded view of area 4A in FIG. 4 with includes the turning node T2 at the juncture between the depth segment S2 and the depth segment S3.

The turning node T2 include a zone Z3 which is in the upper depth segment S2 and a zone Z4 which is in the lower depth segment S3. Within the zone Z3, the vertical profile 121B is becoming shallower and narrower. A point at which the vertical profile 121B ceases to become shallower marks the boundary between the zone Z3 and the zone Z4. The point at which the vertical profile 121B ceases to become shallower is also a point at which a rate of narrowing of the vertical profile 121B ceases to increase with increasing depth. As a consequence, the vertical profile 121B has a rate of narrowing within the zone Z3 that is greater than a rate of narrowing within the zone Z4.

The boundary between the zone Z3 and the zone Z4 is also the boundary between the depth segment S2 and the depth segment S3. In general, boundaries between depth segments S1-S5 are marked by inflection points in the vertical profile 121A or 121B, specifically inflection points at which the vertical profile 121A or 121B ceases to become shallower with increasing depth. Below their inflection points, the vertical profiles 121A or 121B becomes steeper. In other words, at the lower part of each depth segment S1-S4 the vertical profiles 121A and 121B are narrowing and in the upper parts of the underlying depth segment S2-S5 the rate of narrowing is reduced and in some embodiments is reversed so as to turn into a rate of widening. The turning nodes T1 to T4 occur at intersections of the depth segments S1-S5.

In the vertical profile 121B the angle $\theta_2$ is about 90 degrees. In some embodiments, the vertical profile 121B becomes steadily narrower throughout the zones Z3 and Z4. In some embodiments, the vertical profile 121B becomes steadily narrower throughout its depth. In some embodiments, the vertical profile 121B exhibits a constant width in the zone Z4. In some embodiments, the vertical profile 121B exhibits a constant width in an upper portion of each of the depth segments S1-S4. In some embodiments, the depth segments S1-S4 lack bulges. The angle $\theta_1$, however, is less than 90 degrees, may be about 75 degrees or less, or even about 60 degrees or less. In some embodiments, the distance between adjacent turning nodes T1-T4, which correspond to the heights $H_1$-$H_3$, become progressively less with increasing depth.

The vertical profile 121B is suitable when the amount of narrowing from depth segment to depth segment is small or there are sufficiently few depth segments that the overall amount of narrowing is acceptable. In some embodiments, the vertical profile 121B has six or fewer depth segments. In some embodiments, the vertical profile 121B has four or fewer depth segments. The vertical profile 121B may be easier to achieve than the vertical profile 121A and may provide better overall performance in some instances.

In some embodiments, which may have either the vertical profile 121A or the vertical profile 121B, the amount of narrowing between two adjacent depth segments is in the range from about 0.1 nm to about 50 nm. The narrowing may be satisfied by any of $W_5$ minus $W_4$, $W_4$ minus $W_3$, $W_3$ minus $W_2$, or $W_2$ minus $W_1$. In some embodiments, the amount of narrowing is in the range from about 5 nm to about 30 nm. If the amount of narrowing is too great, it may not be possible to form the isolation structure 123. If the amount of narrowing is forced to be too low, the process may be inefficient.

Figure 5:
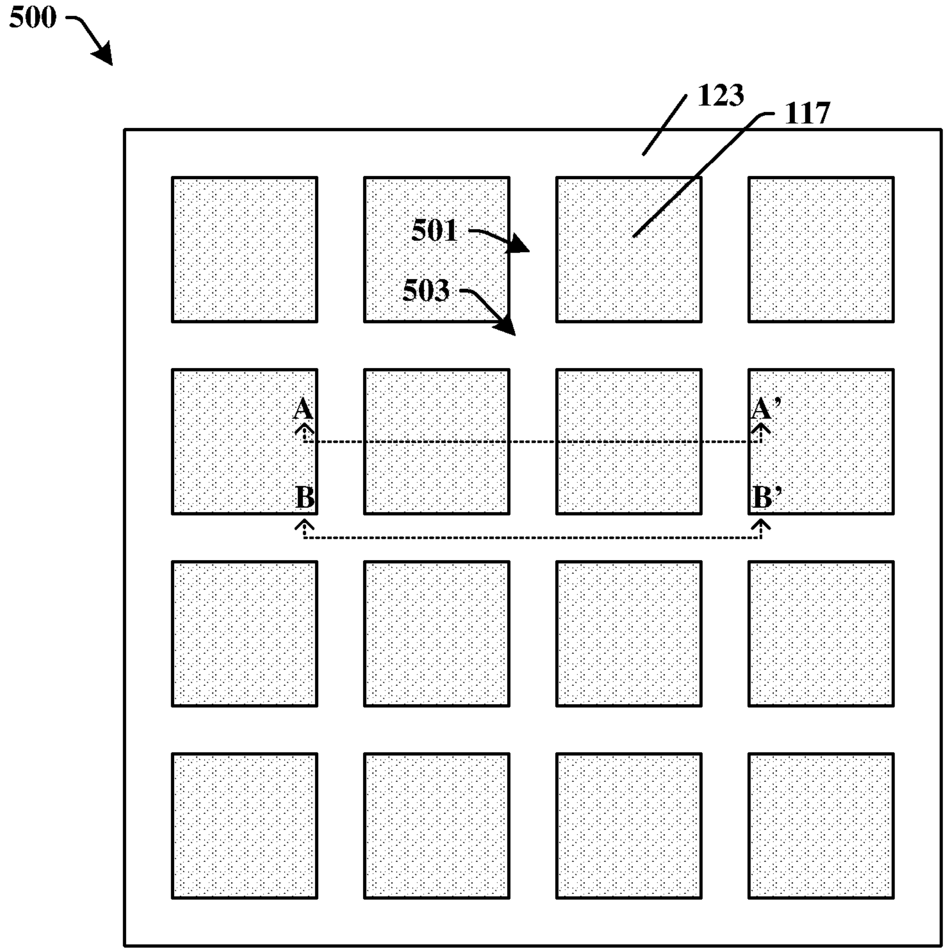
FIG. 5 illustrates a plan view of photodetector pixel array in an IC device according to some embodiments of the present disclosure.

FIG. 5 provides a plan view 500 of the isolation structure 123. The isolation structure 123 includes grid segments 501 that electrically isolate adjacent photodiodes 117 and crossroads 503 that occur at intersections of grid segments 501. The line A-A' of the plan view 500 crosses three of the grid segments 501 and corresponds to the portion of the IC device 100 illustrated by FIG. 1. The cross-sectional view 600 of FIG. 6 focuses on the lower part of the IC device 100 and corresponds to the line B-B'.

Figure 6:
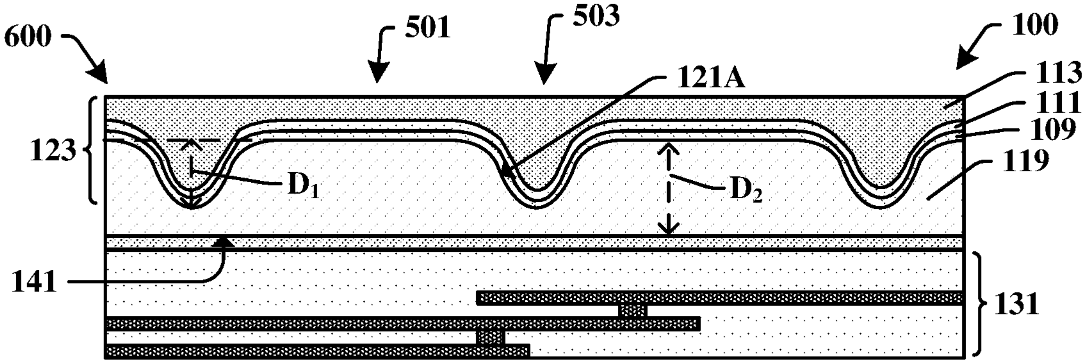
FIG. 6 illustrates a cross-sectional side view of photodetector pixel array in an IC device according to some embodiments of the present disclosure.

As shown in FIG. 6, the isolation structure 123 may be deeper by a distance $D_1$ at the crossroads 503 as a consequence of etch loading. The distance $D_1$ tends to be greater as the widths $W_1$-$W_5$ (see FIG. 2) become smaller. This effect my be mitigated by adjusting etch conditions, for example, by lowering pressure. In some embodiments, the distance $D_1$ is in the range from about 1% to about 20% of the height $H_6$ (see FIG. 2). In some embodiments, the distance $D_1$ is in the range from about 5% to about 10% of the height $H_6$. The height $H_6$ may be adjusted to accommodate this crossroad loading. The extent of this accommodation may be measured by the distance $D_2$, the distance of the isolation structure 123 from the front side 141 in areas away from the crossroads 503. In some embodiments the distance $D_2$ is about 5% or more of the height $H_6$. In some embodiments the distance $D_2$ is about 10% or more of the height $H_6$.

FIGS. 7 through 23 provide cross-sectional view 700-2300 which illustrate a method according to some embodiments of forming an IC device with a photodiode array having an isolation structure according to the present disclosure. While FIGS. 7 through 23 are described with reference to various embodiments of a method, it will be appreciated that the structures shown in FIGS. 7 through 23 are not limited to the method but rather may stand alone separate from the method. FIGS. 7 through 23 are described as a series of acts. The order of these acts may be altered in other embodiments. While FIGS. 7 through 23 illustrate and describe a specific set of acts, some may be omitted in other embodiments. Further, acts that are not illustrated and/or described may be included in other embodiments. While the method of FIGS. 7 through 23 illustrates the formation of the IC device 100 of FIG. 1, the method may be used to form other IC devices.

Figure 7:
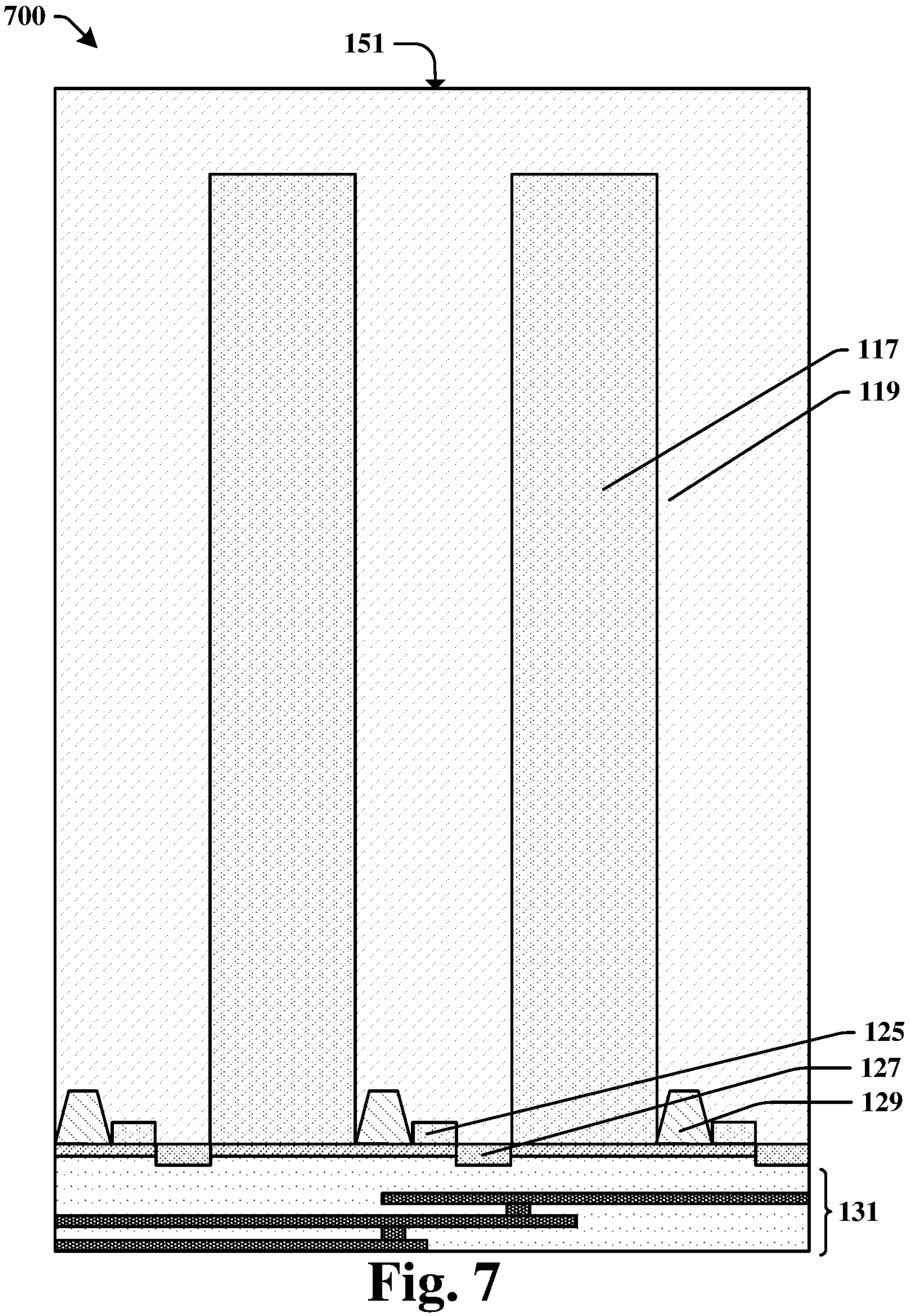
FIGS. 7-23 are a series of cross-sectional view illustrations exemplifying some embodiments of a method of forming an IC device having a photodetector pixel array with an isolation structure according to the present disclosure.

The method of the present disclosure may begin with the structure shown by the cross-sectional view 700 of FIG. 7. This structure may be the product front-end-of-line (FEOL) processing of the semiconductor substrate 119 to produce structures such as the isolation structures 129, the photodiodes 117, the floating diffusion regions 125, and the transfer gates 127, back-end-of-line (BEOL) processing to produce the metal interconnect 131, flipping the semiconductor substrate 119 to place the back side 151 on top, and thinning of the semiconductor substrate 119.

The semiconductor substrate 119 may be, for example, a silicon substrate doped with a p-type dopant such as boron. Alternatively, the semiconductor substrate 119 could be a silicon substrate doped with an n-type dopant such as phosphorous or arsenic. The semiconductor substrate 119 may also be another suitable semiconductor material. Other semiconductor materials that may be suitable include elemental semiconductors such as diamond or germanium; semiconductor compounds such as gallium arsenide, silicon carbide, indium arsenide, or indium phosphide; and alloy semiconductors such as silicon germanium carbide, gallium arsenic phosphide, or gallium indium phosphide.

After FEOL processing and BEOL processing, the semiconductor substrate 119 may be bonded to a second substrate (not shown) through the metal interconnect 131. Thinning may comprise chemical mechanical polishing (CMP) and greatly reduces a thickness of the semiconductor substrate 119. The second substrate may provide structural integrity during and after the thinning process. In some embodiments, the thickness of the semiconductor substrate 119 is reduced to within a range from about 1 μm to about 5 μm. In some embodiments, the thickness is reduced to within the range from about 2 μm to about 4 μm.

Figure 8:
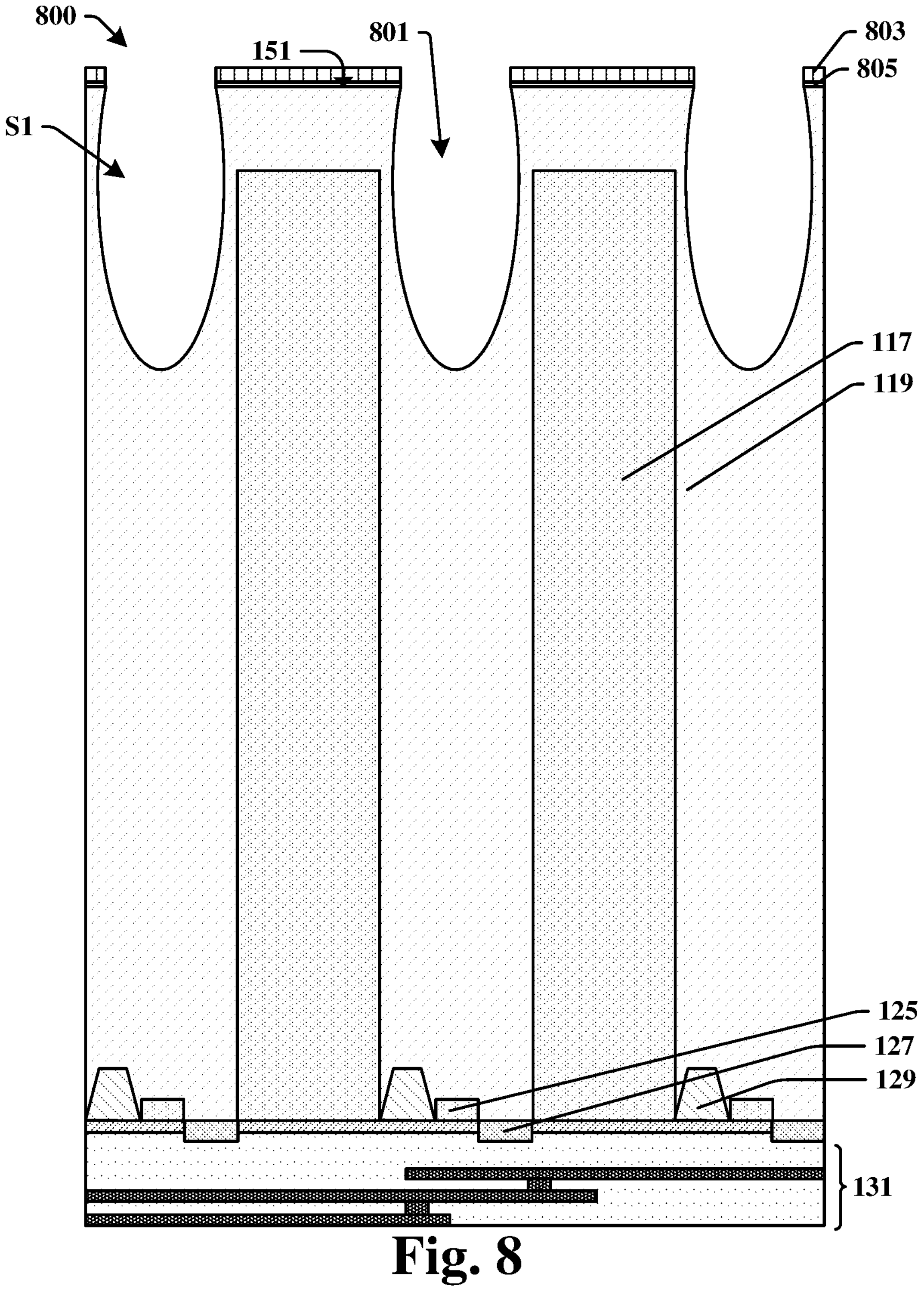

As shown by cross-sectional view 800 of FIG. 8, the method continues with forming a mask 803 on the back side 151 and using it to etch trenches 801 corresponding to the depth segment S1. The mask 803 may be patterned by photolithography. In some embodiments, the mask 803 is a photoresist. In some embodiments, a bottom anti-reflective coating (BARC) 805 is disposed between the mask 803 and the back side 151.

Etching to form the trenches 801 may comprise plasma etching. The etching power may be kept low. In some embodiments, the etch power is sufficiently low that the etch rate is kept below 2 m/min. In some embodiments, the etch power is sufficiently low that the etch rate is about 1 m/min or less. The pressure may also be kept relatively low. If the power is too high, the semiconductor substrate 119 around the trenches 801 may be damaged in a way that causes white pixels in the resulting photodetector array. Varying the power controls the shape of the trenches 801. The pressure also affects the shape of the trenches 801. In some embodiments, the pressure is in the range from about 1 to about 100 millitorr. In some embodiments, the pressure is in the range from about 3 to about 30 millitorr. In some embodiments, the pressure is in the range from about 5 to about 20 millitorr.

Figure 9:
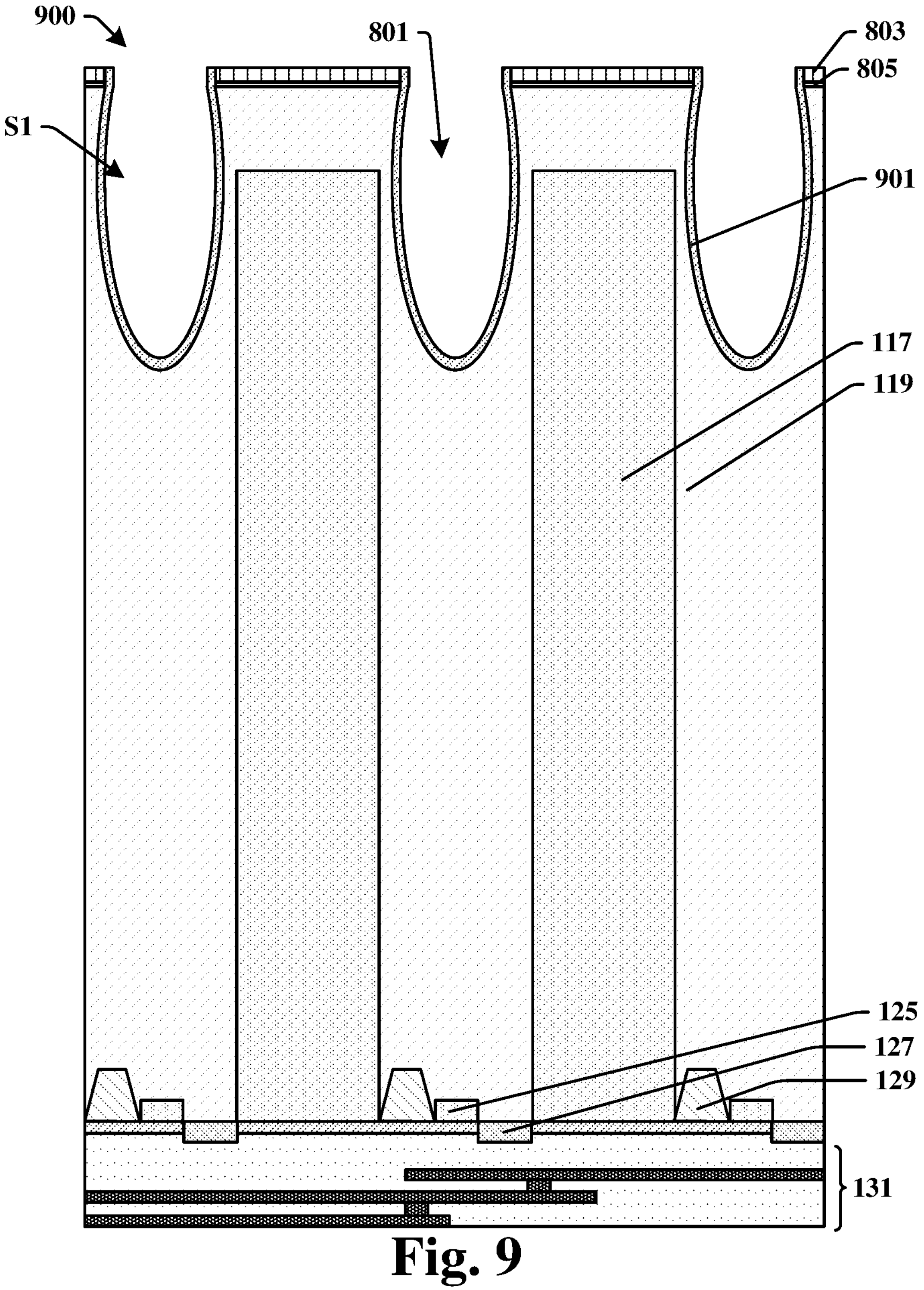

As shown by cross-sectional view 900 of FIG. 9, the trenches 801 are lined with an etch-resistant coating 901. In some embodiments, the etch-resistant coating 901 is a polymer. In some embodiments, the polymer is a fluorocarbon polymer or the like. In some embodiments, the etch-resistant coating 901 is a silicon compound. Examples of silicon compounds that may be suitable include silicon dioxide ($SiO_2$), silicon nitride (SiN), silicon oxynitride (SiON), combinations thereof, and the like. The etch-resistant coating may be formed by chemical vapor deposition (CVD), atomic layer deposition (ALD), the like, or any other suitable process. In some embodiments, the process is a CVD process that is plasma enhanced (PECVD).

The etch-resistant coating 901 may be formed to a suitable thickness to prevent or limit further etching in the first depth segment S1. In some embodiments, the thickness is in the range from about 3 nm to about 30 nm. In some embodiments, the thickness is in the range from about 7 nm to about 10 nm. A thicker etch-resistant coating 901 is desirable to prevent plasma from damaging the semiconductor substrate 119 during subsequent etching. Such damage may result in white pixels.

Figure 10:
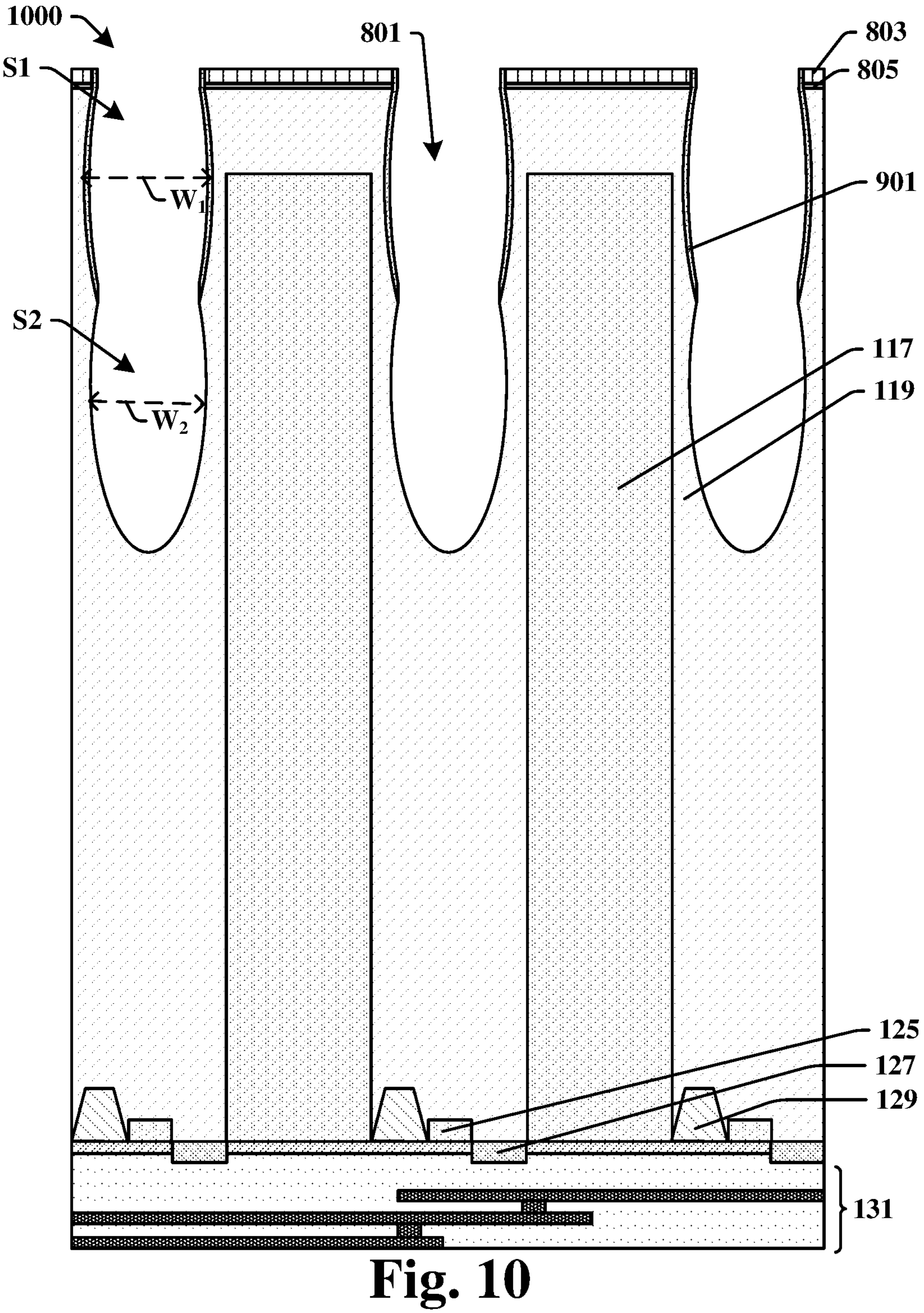

As shown by cross-sectional view 1000 of FIG. 10, the process continues with another etch cycle. The etch breaks through the bottom of the etch-resistant coating 901 and extends the trenches 801 to include the area of the second depth segment S2. In some embodiments, the etch conditions are the same as those used to form the first depth segment S1. If the etch conditions are the same, the height $H_2$ and the width $W_2$ of the second depth segment S2 will be less than the height $H_1$ and the width $W_1$ of the first depth segment S1 (see FIG. 2). The etching may thin the etch-resistant coating 901. If the etch-resistant coating 901 is too thin, the etch-resistant coating 901 may be removed entirely during the process of FIG. 10 and the width $W_1$ may increase to an undesirable extent. A difference between the width $W_2$ and the width $W_1$ may increase in relationship with increasing thickness of the etch-resistant coating 901. If the etch-resistant coating 901 is too thick, the trenches 801 may narrow excessively between the first depth segment S1, the second depth segment S2, and subsequent depth segments. According, a thickness of the etch-resistant coating 901 may be selected to achieve a balance between limiting narrowing of the trenches 801 and preventing damage to the semiconductor substrate 119 that could result in white pixels.

Figure 11:
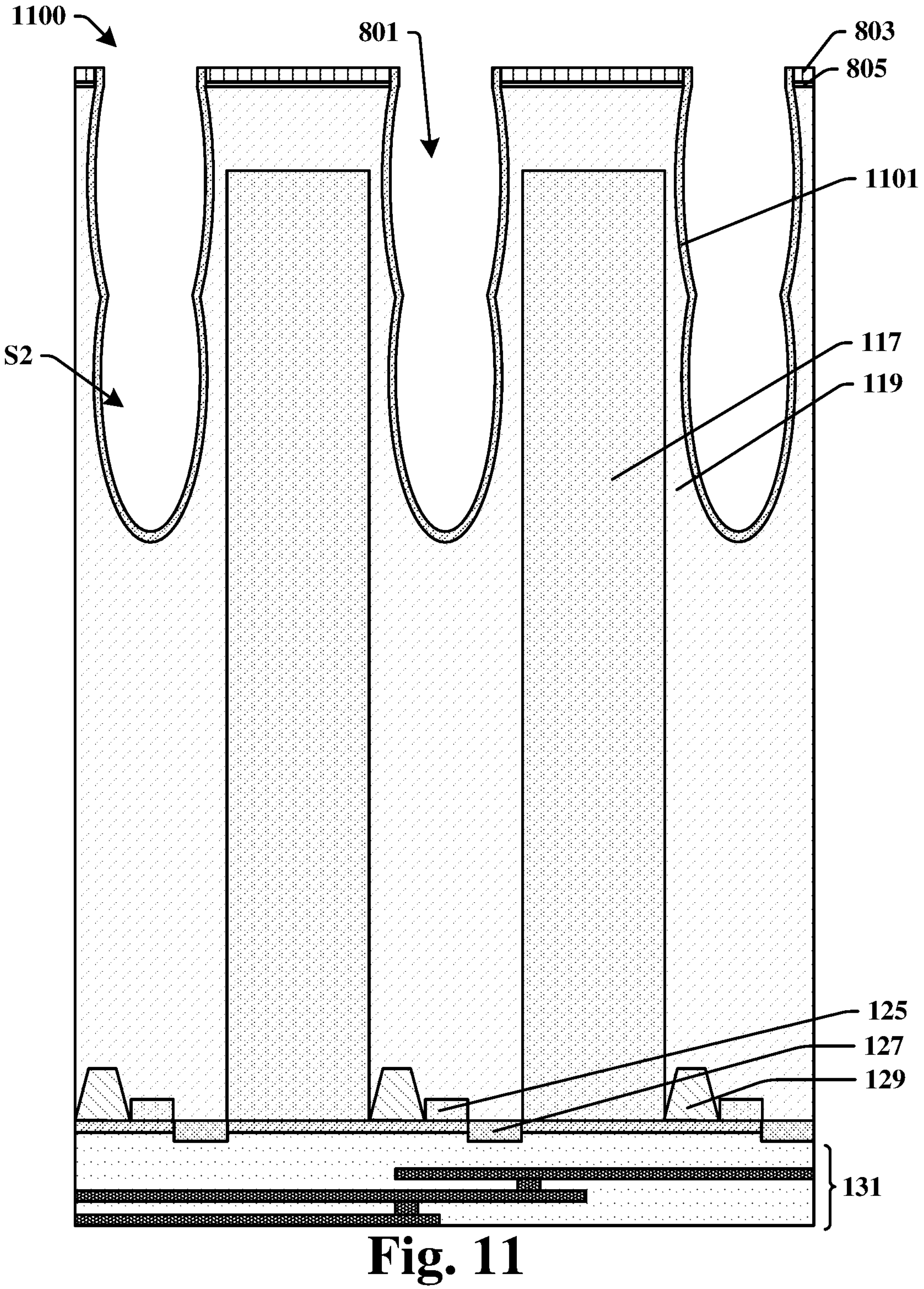
Figure 12:
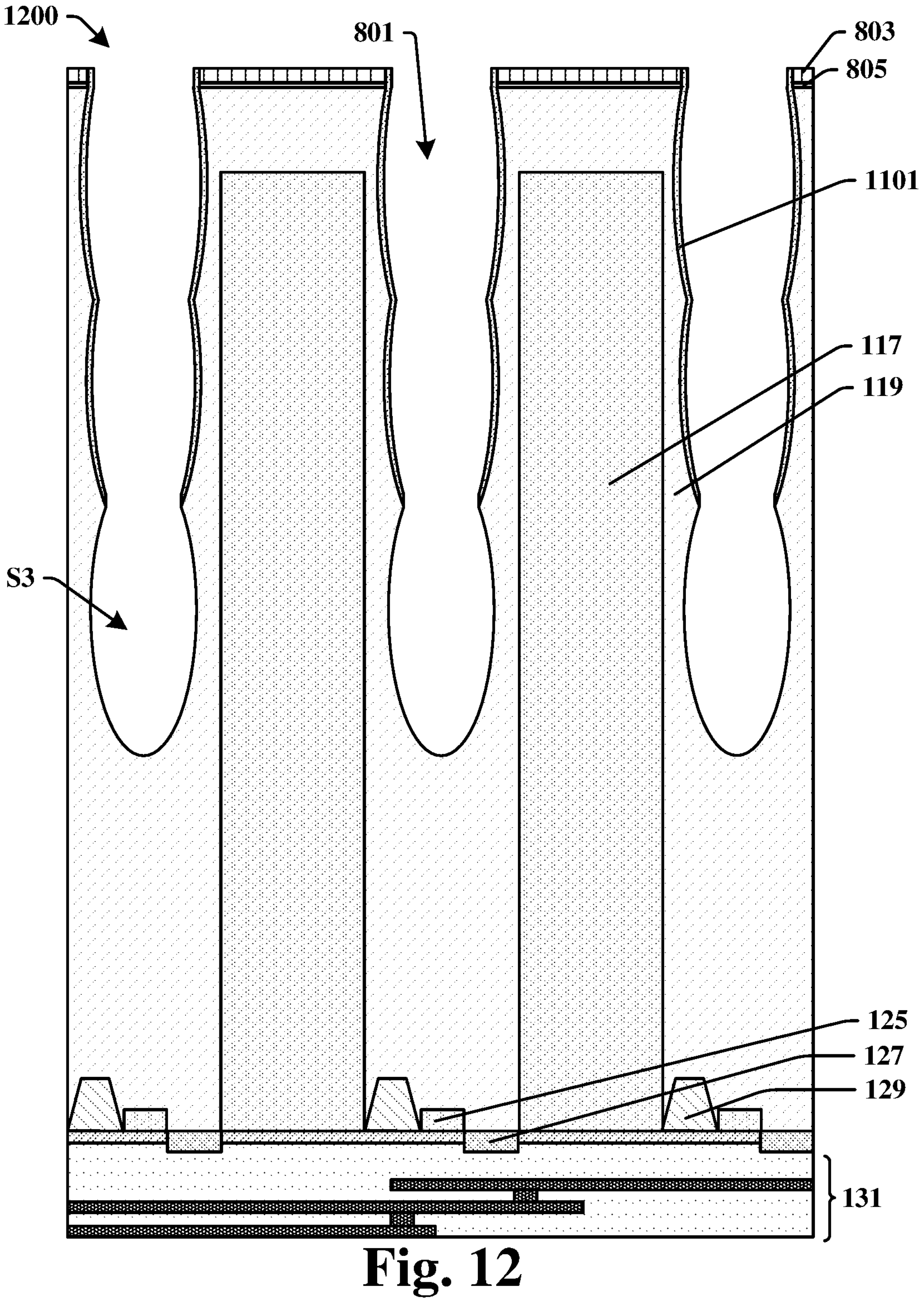
Figure 13:
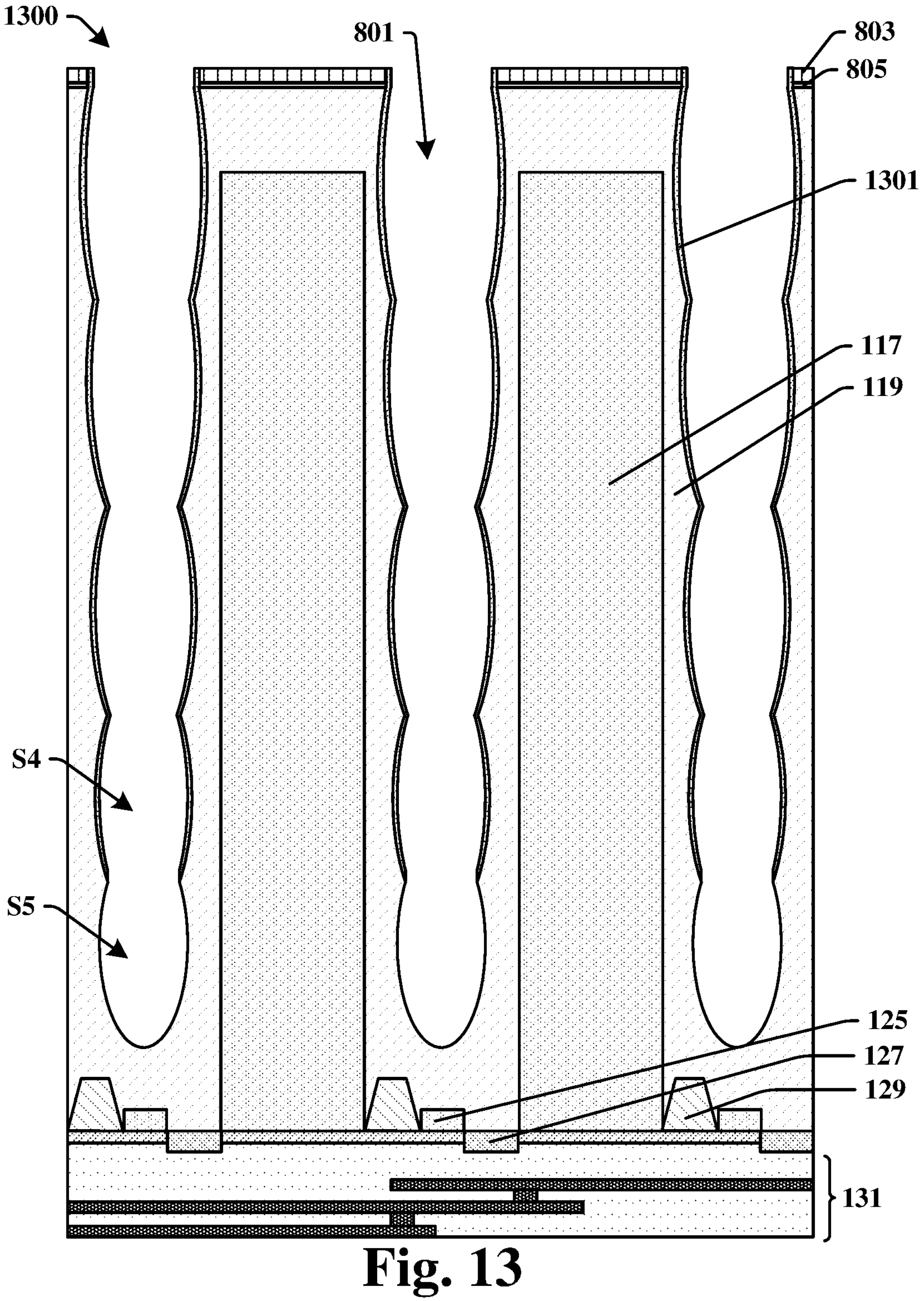

As shown by cross-sectional view 1100 of FIG. 11, the trenches 801 are relined with a new etch-resistant coating 1101. The process of forming the new etch-resistant coating 1101 may be the same as the one used to form the etch-resistant coating 901 (see FIG. 9). As shown by cross-sectional view 1200 of FIG. 12, another etch cycle may be carried out to extend the trenches 801 to include the area of the third depth segment S3. As shown by cross-sectional view 1300 of FIG. 13, the cycles of coating and etching may be repeated until the trenches 801 include all the depth segments S1-S5. In some embodiments, the etch and coating steps are all carried out in one tool whereby these steps may rapidly alternate. The pressure in the tool may remain nearly constant through these operations.

After the etching is complete a residual etch-resistant coating 1301 may remain. As shown by the cross-sectional view 1400 of FIG. 14, the residual etch-resistant coating 1301 may be stripped. The stripping process may include plasma etching, wet etching, ashing, the like, or any other suitable process.

Figure 15:
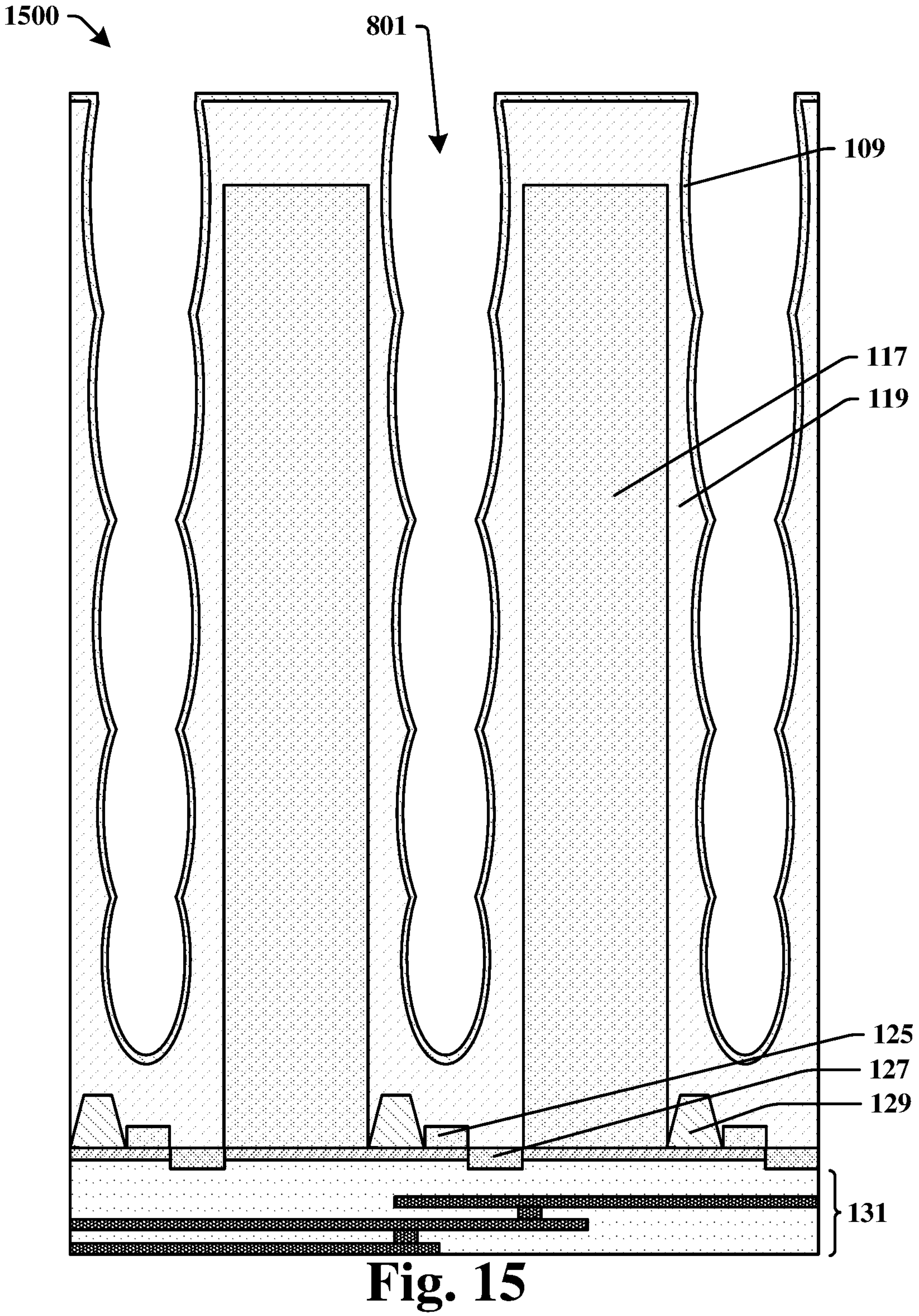

As shown by cross-sectional view 1500 of FIG. 15, the trenches 801 may be lined with the first dielectric layer 109. In some embodiments, the first dielectric layer 109 is one or more layers of high-x dielectric. A high-x dielectric layer may be or comprise hafnium oxide (HfO), aluminum oxide (AlO), zirconium oxide (ZrO), titanium oxide (TiO), strontium oxide (SrO), barium oxide (BaO), barium titanate ($BaTiO_3$), tantalum oxide ($Ta_2O_3$), lanthanum oxide ($La_2O_3$), yttrium oxide ($Y_2O_3$), the like, some other suitable high-x dielectric, or a mixture thereof. The first dielectric layer 109 may be deposited conformally on the sidewalls of the trenches 801 by physical vapor deposition (PVD), CVD, ALD, the like, or any other suitable process. In some embodiments, the first dielectric layer 109 has a thickness in the range from about 50 Angstroms to about 250 Angstroms. In some embodiments, the thickness is the range from about 100 Angstroms to about 180 Angstroms.

Figure 16:
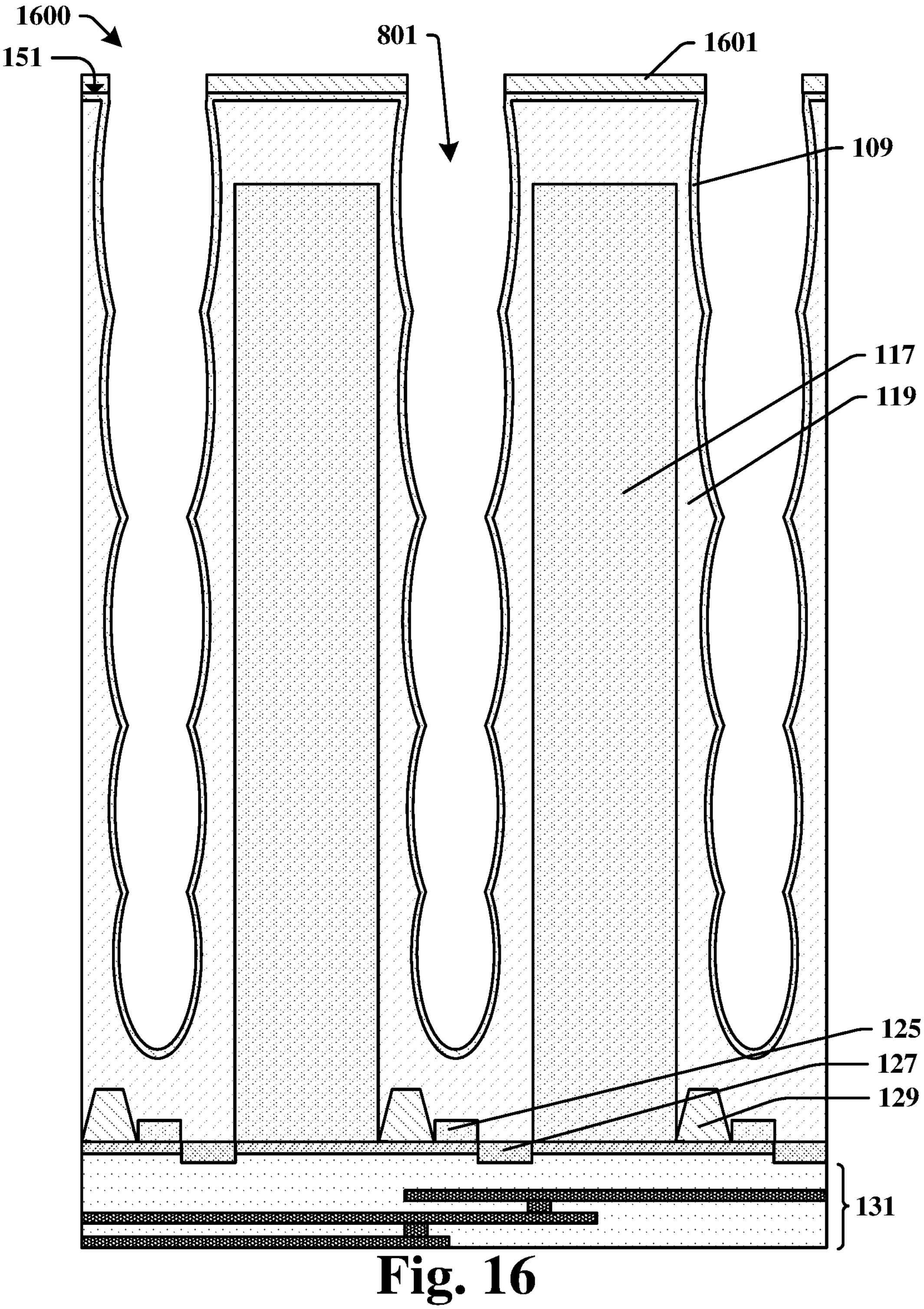

As shown by cross-sectional view 1600 of FIG. 16, a high-x capping layer 1601 may be formed over the back side 151. The high-x capping layer 1601 may be a high-k dielectric layer deposited by a non-conformal deposition process. The nonconformal deposition process may be PVD, CVD, the like, or some other suitable process. The processes of forming the first dielectric layer 109 and the high-x capping layer 1601 may be combined or overlap whereby some of the material that forms the high-x capping layer 1601 also forms the first dielectric layer 109. In some embodiments, the high-x capping layer 1601 has a thickness from about 300 Angstroms to about 700 Angstroms.

Figure 17:
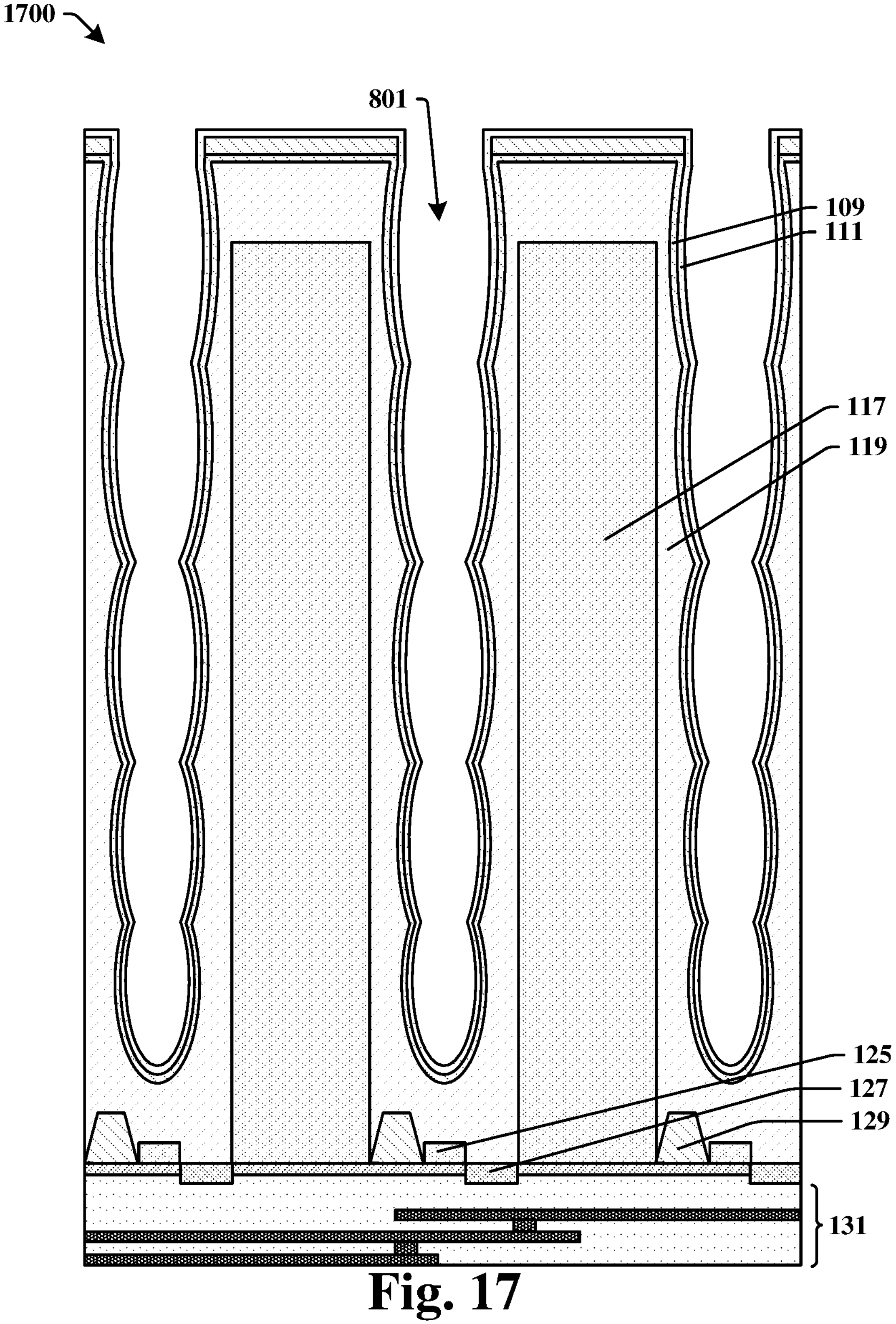

As shown by cross-sectional view 1700 of FIG. 17, the trenches 801 may also be lined with the second dielectric layer 111. The second dielectric layer 111 may be deposited by PVD, CVD, ALD, the like, or some other suitable process. In some embodiments, the second dielectric layer 111 is an oxide. In some embodiments, the second dielectric layer 111 is silicon dioxide ($SiO_2$), silicon nitride (SiN), silicon oxynitride (SiON), a combination thereof, or the like. In some embodiments, the second layer 111 has a thickness in the range from about 50 Angstroms to about 300 Angstroms. In some embodiments, the thickness is in the range from about 150 Angstroms to about 250 Angstroms.

Figure 18:
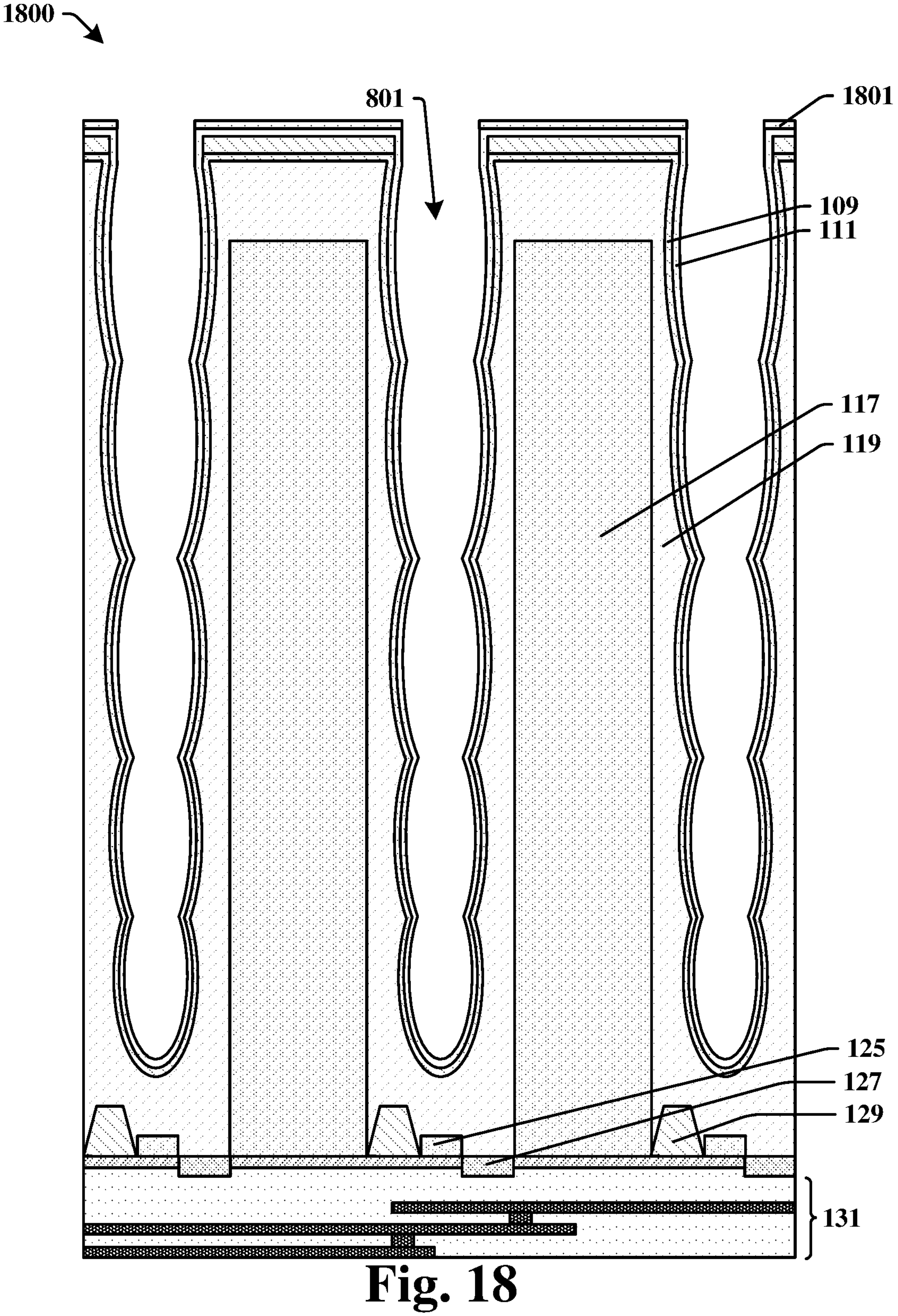

As shown by the cross-sectional view 1800 of FIG. 18, a second capping layer 1801 may be formed. The second capping layer 1801 may be deposited by a non-conformal deposition process such PVD, CVD, the like, or some other suitable process. In some embodiments, the second capping layer 1801 is an oxide. In some embodiments, the second capping layer 1801 is silicon dioxide ($SiO_2$), silicon nitride (SiN), silicon oxynitride (SiON), a combination thereof, or the like. The formation of the second capping layer 1801 may be combined with or overlap the formation of the second dielectric layer 111. In some embodiments, the second capping layer 1801 has a thickness in the range from about 200 Angstroms to about 1500 Angstroms. In some embodiments, the thickness is in the range from about 300 Angstroms to about 700 Angstroms.

Figure 19:
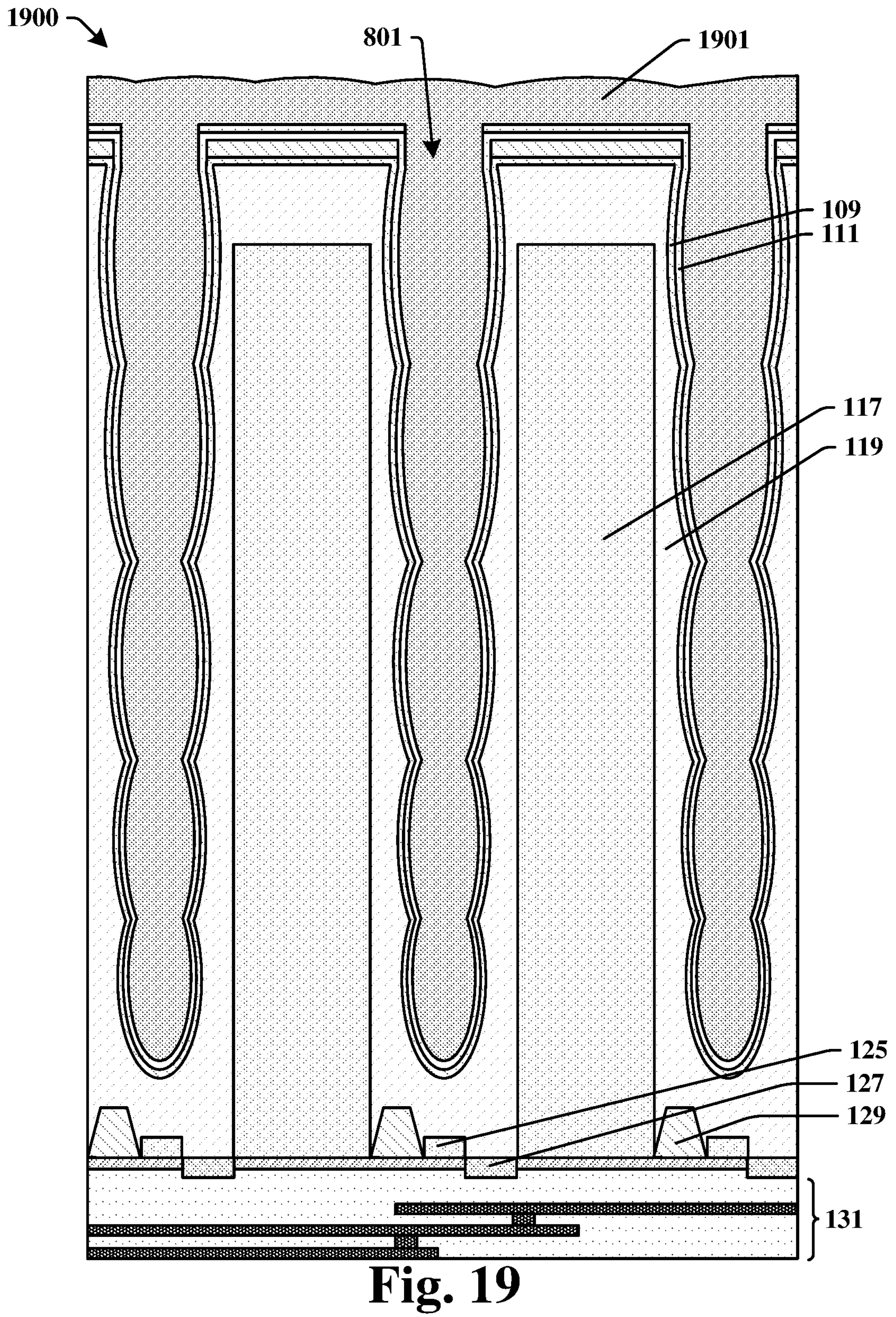

As shown by the cross-sectional view 1900 of FIG. 19, a conductive layer 1901 is deposited so as to fill the trenches 801. The conductive layer 1901 may be a metal that lends itself to a process with good gap fill. In some embodiments, the conductive material is tungsten (W), aluminum (Al), or the like. The conductive material may be deposited by CVD, PVD, electroplating, electroless plating, or the like. In some embodiments, a conductive liner is deposited before the conductive material. A conductive liner may be, for example, titanium nitride, tantalum, nitride, or the like. The liner may be deposited to a thickness in the range from about 20 Angstroms to about 100 Angstroms, e.g., 50 Angstroms. The conductive material may be deposited to a thickness in the range from about 1000 Angstroms to about 3000 Angstroms.

Figure 20:
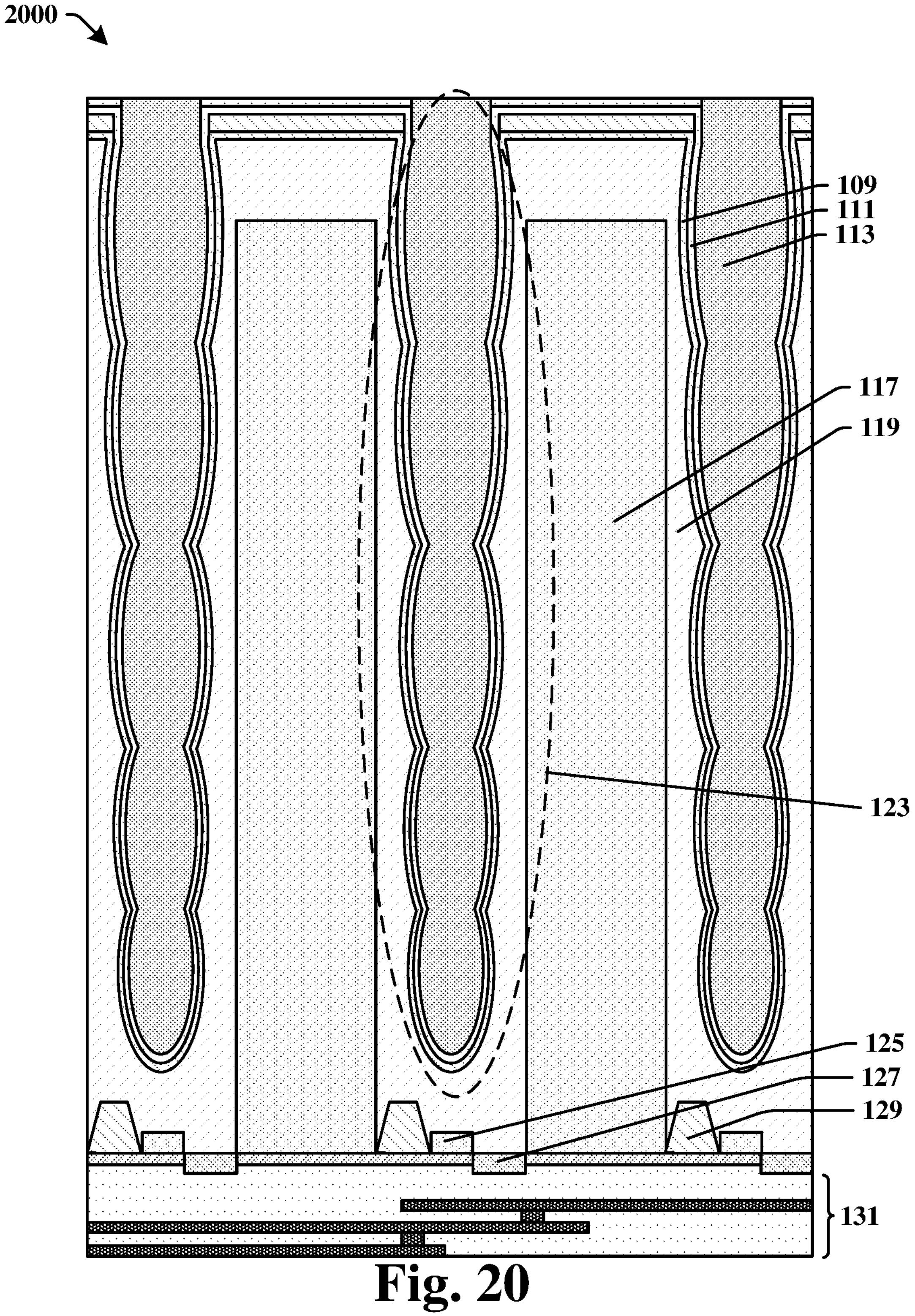

As shown by the cross-sectional view 2000 of FIG. 20, a planarization process may be carried out to remove a excess portion of the conductive layer 1901. The planarization process may be chemical mechanical polishing (CMP), the like, or some other suitable process. The remaining conductive material forms the in-substrate metal grid 113. The in-substrate metal grid 113 together with the first dielectric layer 109 and the second dielectric layer 111 provides the isolation structure 123. In some embodiments, CMP reduces the second capping layer 1801 to a thickness in the range from about 500 Angstroms to about 800 Angstroms. In some embodiments, CMP reduces the second capping layer 1801 to a thickness in the range from about 200 Angstroms to about 500 Angstroms, e.g., about 400 Angstroms.

Figure 21:
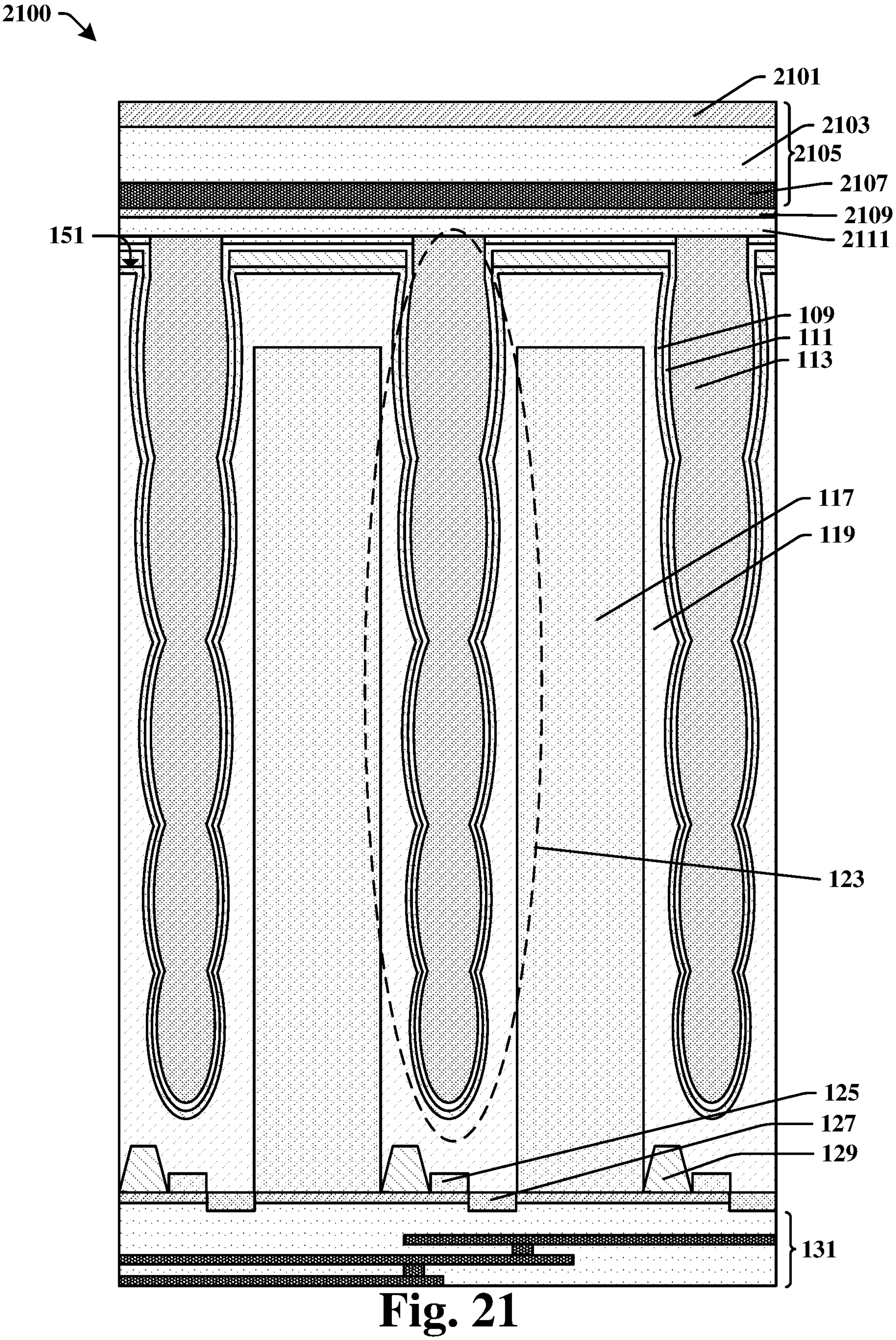

As shown by the cross-sectional view 2100 of FIG. 21, additional layers are formed on the back side 151 over the isolation structure 123. These may include a thick dielectric layer 2111, an etch stop layer 2109, and a composite grid stack 2105. The thick dielectric layer 2111 may be one or more layers of silicon dioxide ($SiO_2$), the like, or any other suitable dielectric(s). In some embodiments, the thick dielectric layer 2111 is deposited to a thickness a thickness in the range from about 1 μm to about 5 μm. In some embodiments, the thick dielectric layer 2111 is deposited to a thickness in the range from about 2 μm to about 4 μm, e.g., about 3 μm.

The etch stop layer 2109 may be formed on the structure illustrated by the cross-sectional view 1800 of FIG. 18. The etch stop layer 2109 may be silicon nitride (SiN), the like, or some other suitable dielectric. The etch stop layer 2109 may be formed by PVD, CVD, ALD, the like, or any other suitable process. In some embodiments, the etch stop layer 2109 has a thickness from about 400 Angstroms to about 1200 Angstroms. In some embodiments, the etch stop layer 2109 has a thickness from about 600 Angstroms to about 1000 Angstroms, e.g., about 880 Angstroms.

The composite grid stack 2105 may include a metal layer 2107, a dielectric layer 2103, and a hard mask layer 2101. Openings (not shown) may be formed in the back side 151 outside the area of photodiodes 117 so that when the metal layer 2107 is deposited it fills the openings and forms ground bars (not shown) within the semiconductor substrate 119. The metal layer 2107 may comprise any suitable metal or combination of metals. In some embodiments, the metal layer 2107 comprises tungsten (W), the like, or some other suitable metal. In some embodiments, the metal layer 2107 includes a liner layer of titanium nitride (TiN), tantalum nitride (TaN), or the like. The dielectric layer 2103 may be or comprise silicon dioxide ($SiO_2$), the like, or any other suitable dielectric. The hard mask layer 2101 may be a nitride, a carbide, the like, a combination thereof, or any other suitable hard mask material. These layers may be deposited by a combination of CVD, PVD, electroplating, electroless plating, the like, or any other suitable processes.

Figure 22:
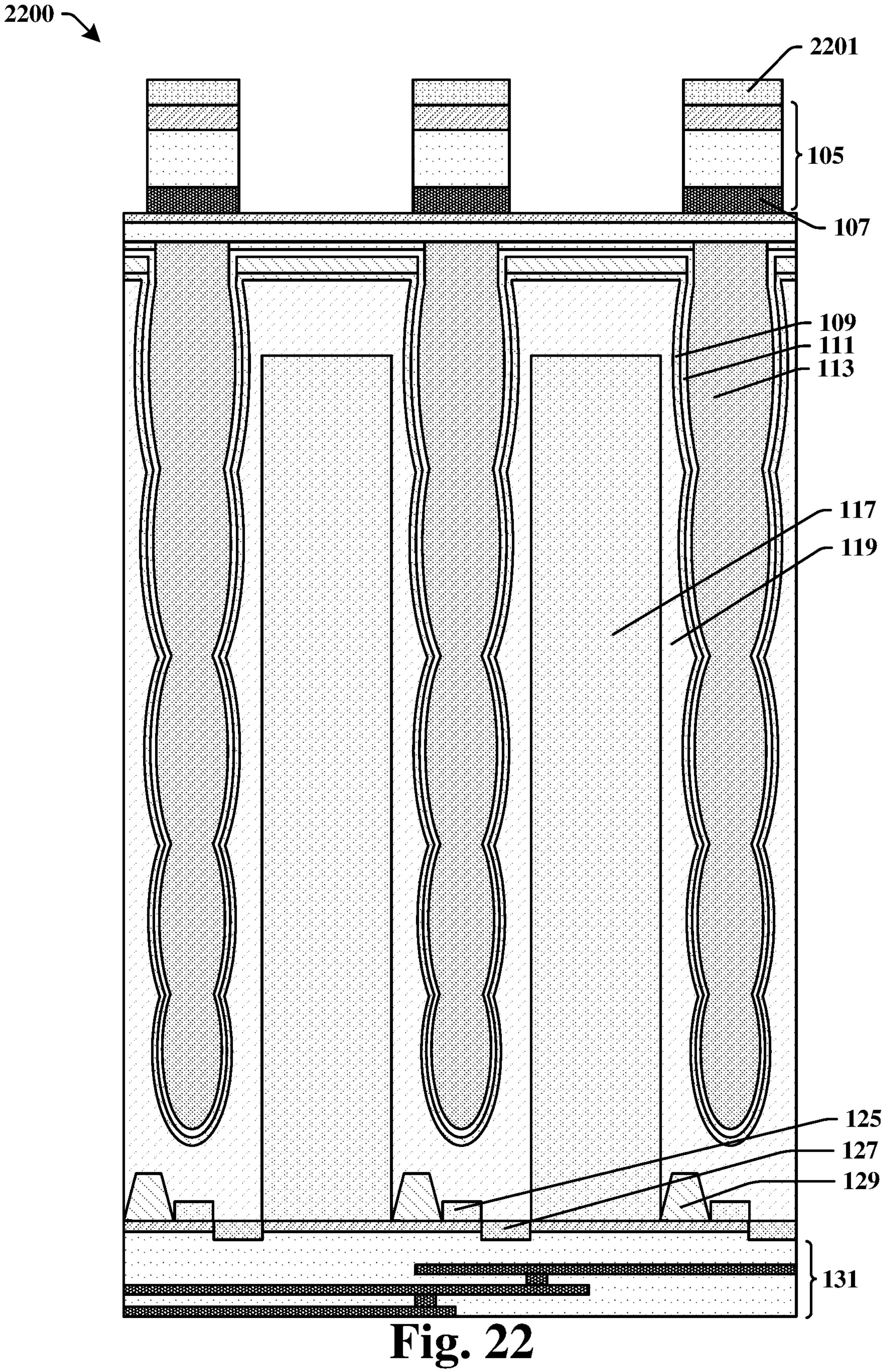

As shown by the cross-sectional view 2200 of FIG. 22, a mask 2201 may be formed and used to define the composite grid 105 from the composite grid stack 2105. The process is an etch that removes the composite grid stack 2105 from areas over the photodiodes 117. The etching defines the back side metal grid 107 from the metal layer 2107. After the etching, the mask 2201 may be stripped.

Figure 23:
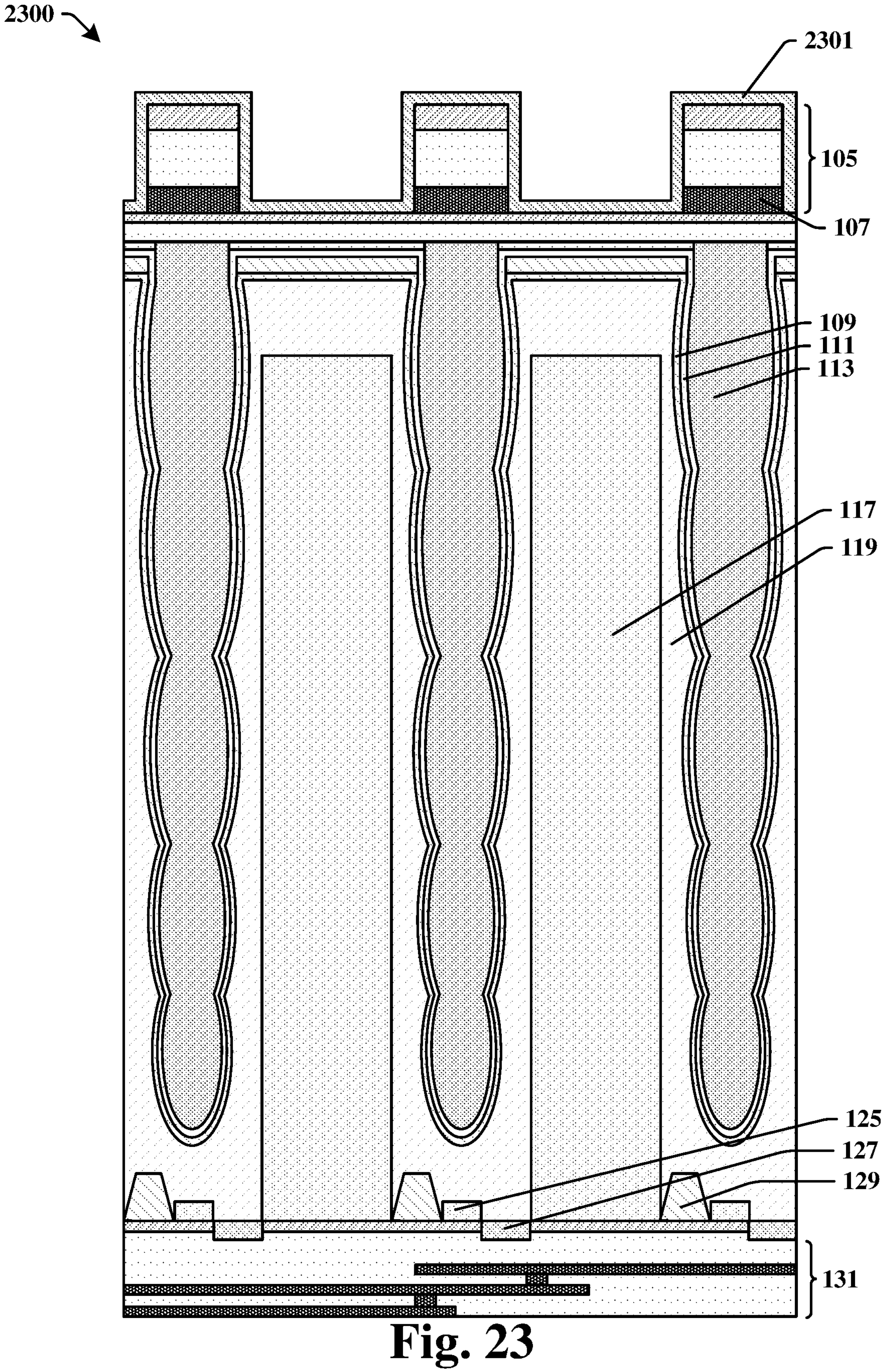
Figure 24:
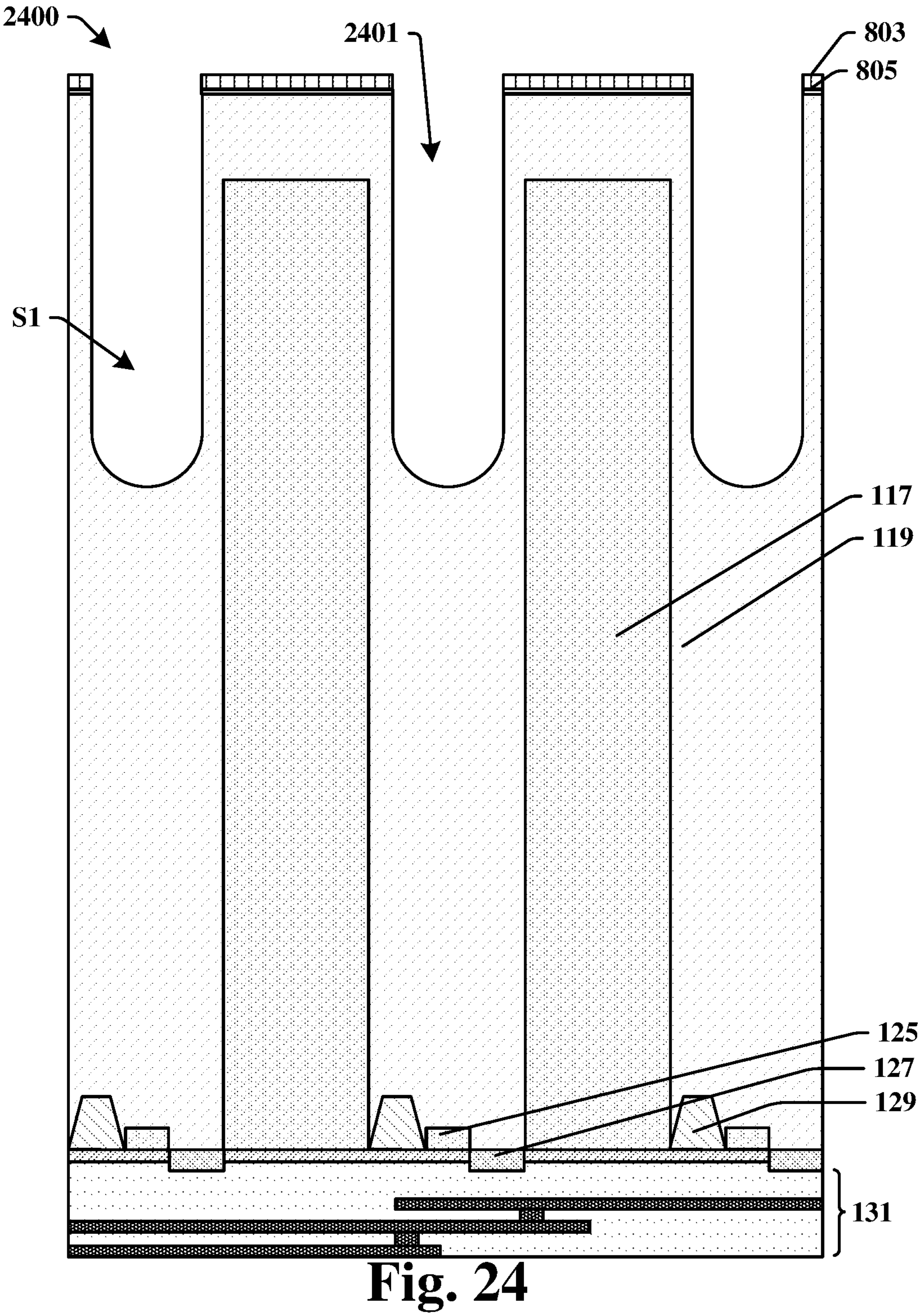
FIG. 24-27 are a series of cross-sectional view illustrations showing some embodiments of a variation on the method of FIGS. 7-23.

As shown by the cross-sectional view 2300 of FIG. 23, an encapsulation layer 2301 may be formed over the structure illustrated by the cross-sectional view 2200 of FIG. 22. The encapsulation layer 2301 may be an oxide, the like, or some other suitable dielectric. Color filters 103 may be formed over the photodiodes 117 within the composite grid 105 and micro-lenses 101 may be formed under the color filters 103 to form a structure such as that illustrated in FIG. 1.

FIGS. 24 through 27 are a series of cross-sectional views 2400-2700 illustrating a variation on the process of FIGS. 7 through 23. This variation may be used to produce the IC device 300 of FIG. 3. As shown by the cross-sectional view 2400 of FIG. 24, the variation begins with a difference in etching conditions that produces the trenches 2401 rather than the trenches 801 (see FIG. 8). The conditions are varied such that the upper portions of the trenches 2401 have substantially vertical sidewalls. The sidewalls may be made more vertical by increasing the plasma energy. The higher energy may accelerate the etch process. The reduction in lateral etching may improve control of trench widths. The trenches 2401 will become narrow with each succeeding depth segment, but the trenches 2401 can be completed with sufficiently few depth segments that this narrowing does not become problematic.

Figure 25:
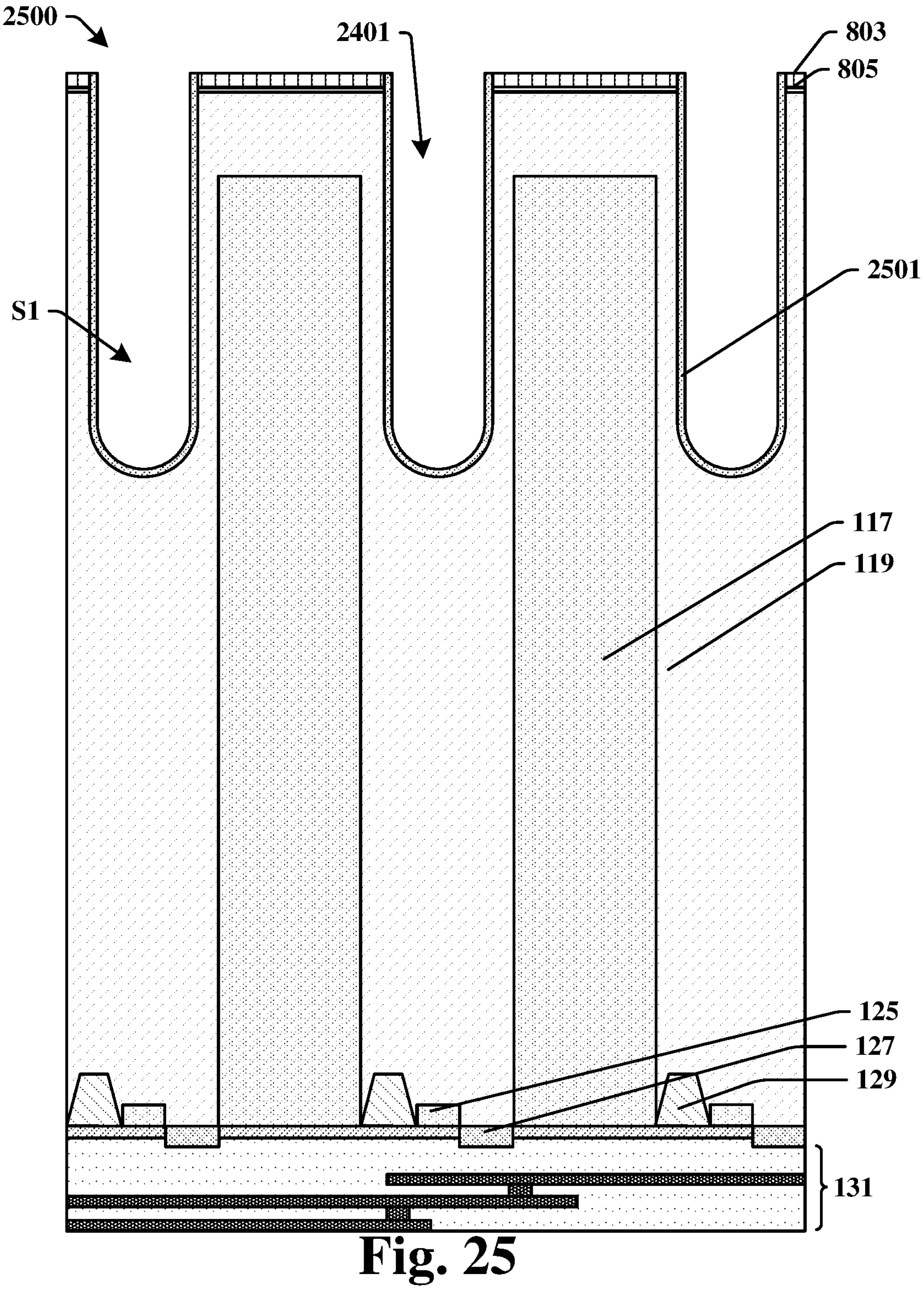
Figure 26:
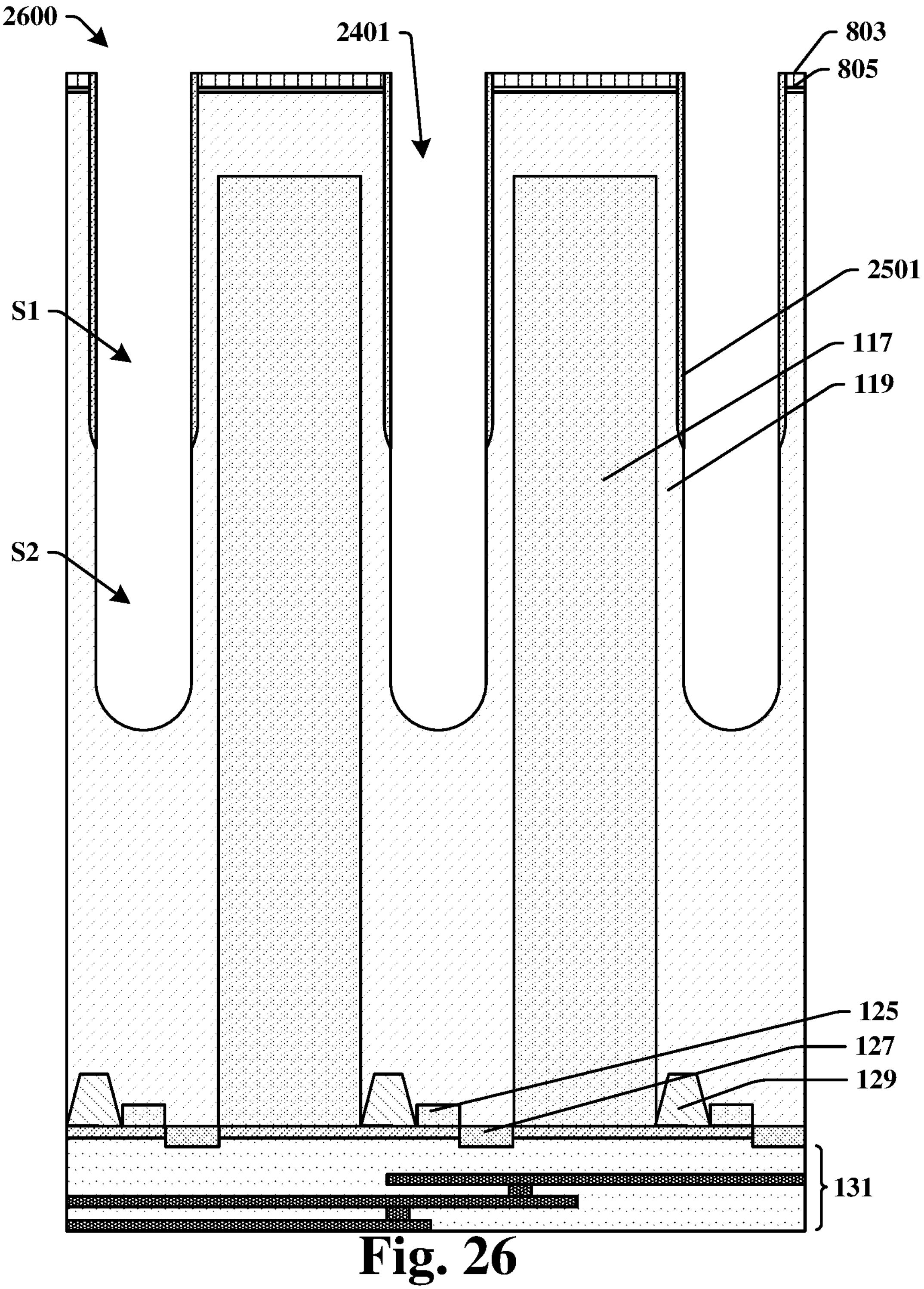
Figure 27:
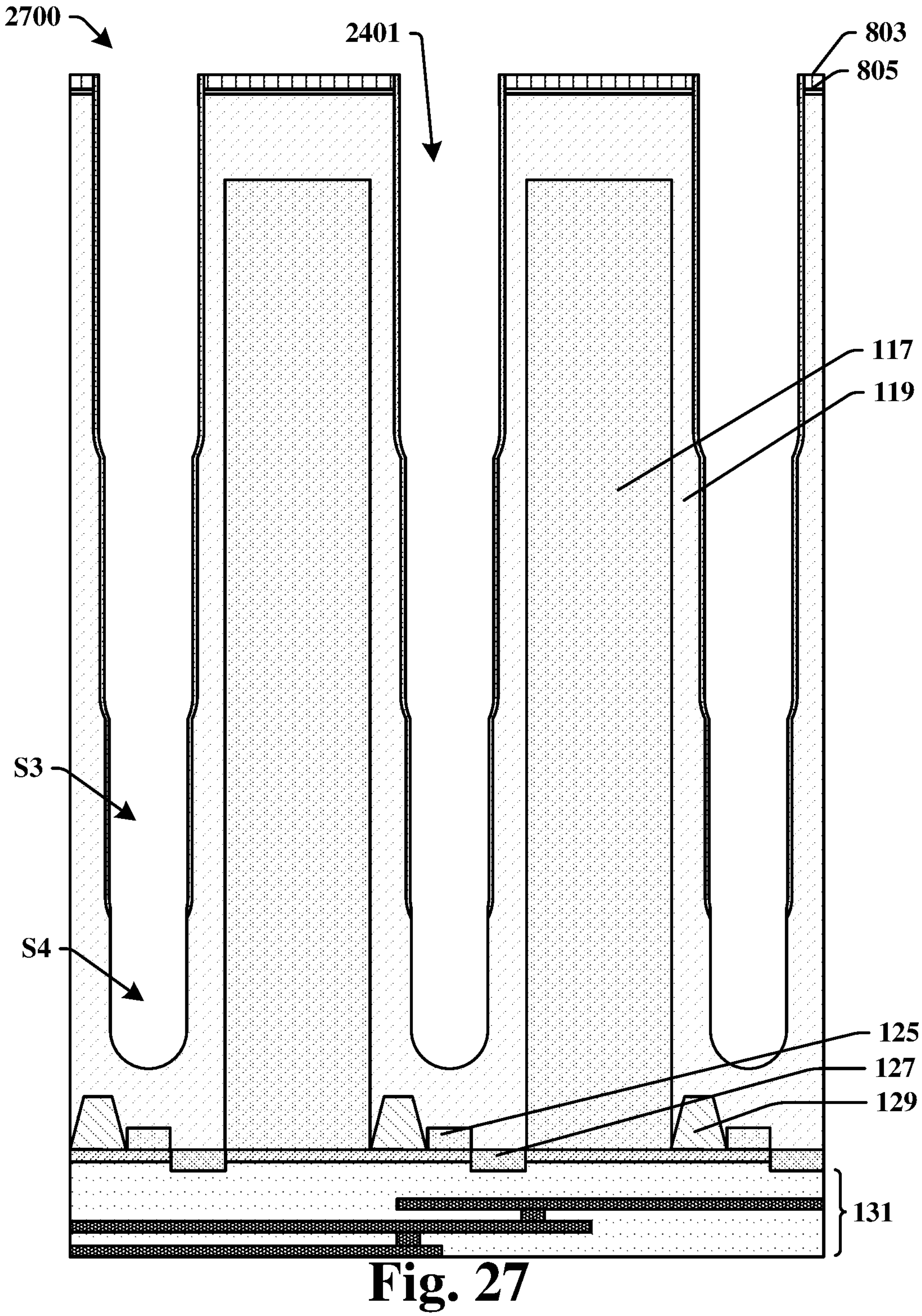

As show by the cross-sectional view 2500 of FIG. 25, the trenches 2401 are lined with an etch resistance coating 2501. As show by the cross-sectional view 2600 of FIG. 26, another etch is carried out which breaks through the bottom of the etch resistance coating 2501 and deepens the trenches 2401. As show by the cross-sectional view 2700 of FIG. 27, the cycles of coating and etching are repeated until the trenches 2401 are fully formed. The process may then continue as shown by the cross-sectional views 1400-2300 of FIGS. 14-23 to produce an IC device such as the IC device 300 of FIG. 3.

Figure 28:
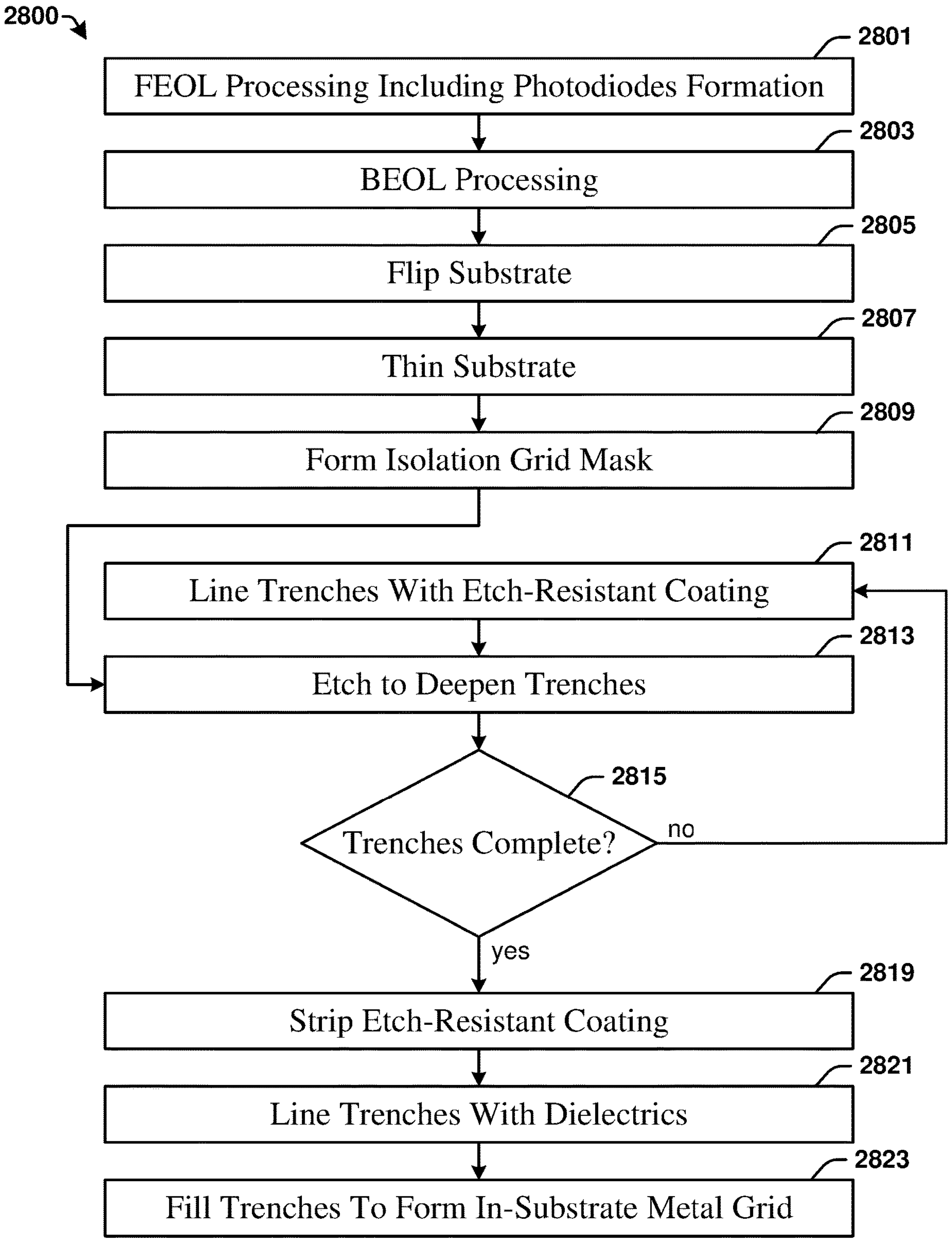
FIG. 28 provides a flow chart illustrating a method according to some embodiments of forming an IC device having a photodetector pixel array with an isolation structure of the present disclosure.

FIG. 28 presents a flow chart for a process 2800 that may be used to form an IC device with a photodiode array having an isolation structure according to the present disclosure. While the process 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 2800 begins with act 2801, FEOL processing. That processing includes the formation of photodiodes and other photodetector components on the front side of the substrate. The process may continue continues with act 2803, BEOL processing. BEOL processing forms a metal interconnect that includes circuitry for operating the CMOS image sensor. Act 2805 is flipping the substrate. Optionally the substrate is attached to another substrate before or after flipping. Act 2807 is thinning the substrate. The cross-sectional view 700 of FIG. 7 illustrates the result of processing up to this point.

Act 2809 is forming a mask for an etch process by which trenches are formed in the substrate for the isolation grid. The cross-sectional view 800 of FIG. 8 illustrates this mask. The process continues with act 2813, etching to add a depth segment to the trenches. The cross-sectional view 800 of FIG. 8 provides an example. Act 2815 is a decision step. According to this decision step, the process 2800 will continue with cycles that include act 2811, lining the trenches with an etch-resistant coating and act 2813, etching to deepen the trenches, until the trenches have been etched to a desired depth. The cross-sectional views 900-1300 of FIGS. 9-13 provide an example. The cross-sectional views 2400-2700 of FIGS. 24-27 provide another example.

Figure 14:
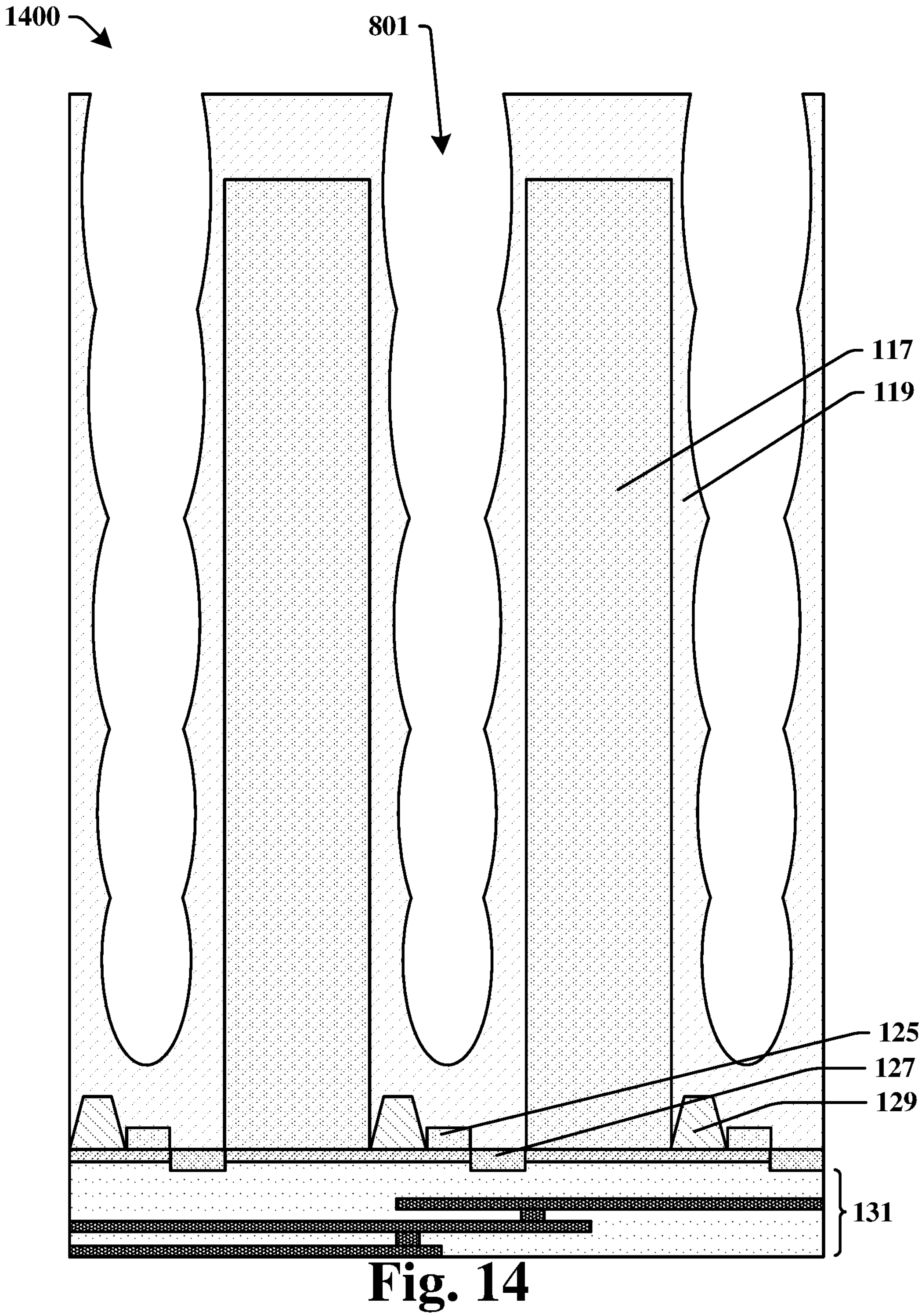

Act 2819 is stripping away the etch-resistant coating. The cross-sectional view 1400 of FIG. 14 provides an example. Depending on the composition of the coating, this step may be optional. Act 2821 is lining or filling the trenches with dielectrics. The cross-sectional views 1500-1700 of FIGS. 15-17 provide an example. Act 2823 is forming an in-substrate metal grid within the trenches. The cross-sectional views 1900-2000 of FIGS. 19-20 provide an example. This step is also optional. Additional processing may take place to provide an IC device such as the IC device 100 of FIG. 1 or the IC device 300 of FIG. 3.

Some aspects of the present disclosure relate to an IC device that includes a semiconductor substrate, a plurality of photodetector regions in the semiconductor substrate, and an isolation structure in the semiconductor substrate. The isolation structure extends between the photodetector regions and has a vertical profile that includes a plurality of vertically spaced turning nodes. The turning nodes include an upper portion through which the vertical profile is becoming narrower with increasing depth and a sidewall angle of the vertical profile is becoming shallower and a lower portion through which the sidewall angle is becoming steeper or remains constant. In some embodiments, the vertical profile becomes wider in the lower portion. In some embodiments, the vertical profile has a constant width within the lower portion. In some embodiments, the vertical profile becomes progressively narrower through one of the turning nodes. In some embodiments, the vertical profile becomes progressively narrower through a plurality of the turning nodes. In some embodiments, the vertical profile comprises three or more of the turning nodes. In some embodiments, a distance between turning nodes becomes progressively shorter with increasing depth. In some embodiments, a maximum width of the vertical profile between adjacent turning nodes becomes smaller with increasing depth. In some embodiments, the isolation structure includes a metal grid with a dielectric liner. In some embodiments, the isolation structure is a back side isolation structure comprising a grid of segments that extend between adjacent photodiodes. In some embodiments, the isolation structure extends more deeply into the semiconductor substrate at intersections of the segments.

Some aspects of the present disclosure relate to an IC device that includes a semiconductor substrate, a first photodetector region and a second photodetector region within the semiconductor substrate, and an isolation structure separating the first photodetector region from the second photodetector region. The isolation structure has a vertical profile having a plurality of depth segments including an upper segment and a lower segment. The vertical profile has a rate of narrowing with respect to depth that is higher at a bottom of the upper segment than at a top of the lower segment than. In some embodiments, the vertical profile has a first bulge in the upper segment and a second bulge in the lower segment. In some embodiments, the vertical profile has three or more bulges corresponding to the plurality of depth segments and the bulges become progressively more closely spaced with increasing distance from a back side of the semiconductor substrate. In some embodiments, the bulges become progressively narrower with increasing distance from the back side.

Some aspects of the present disclosure relate to a method that includes providing a semiconductor substrate having a front side and a back side, forming a photodetector region in the front side, forming a mask on the back side that has a grid of openings with segments around the photodetector region, etching trenches through the mask to a depth, forming a first liner in the trenches, etching through the first liner, etching to increase the depth of the trenches, and filling the trenches to form a structure that provides isolation for the photodetector region. In some embodiments, etching to increase the depth of the trenches causes the trenches to widen at a point below the first liner. In some embodiments, etching to increase the depth of the trenches causes the trenches to have a vertical sidewall that extends from the first liner. In some embodiments the method further includes forming a second liner in the trenches, etching through the second liner, and etching to further increase the depth of the trenches. In some embodiments, filling the trenches comprising lining the trenches with a dielectric and then filling the trenches with metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

providing a semiconductor substrate having a first side and a second side, opposite the first side;

forming a photodetector region in the first side;

forming a mask over the second side, wherein the mask has a grid of openings comprising segments laterally adjacent the photodetector region;

etching trenches through the mask to a depth, wherein the trenches are defined by sidewalls of the semiconductor substrate;

forming a first liner in the trenches;

etching through the first liner;

etching to increase the depth of the trenches;

forming a second liner in the trenches;

etching through the second liner; and etching to further increase the depth of the trenches below the second liner;

forming a third liner in the trenches;

etching through the third liner; and etching to further increase the depth of the trenches below the third liner; and filling the trenches to form a structure that provides isolation for the photodetector region.

2. The method of claim 1, wherein etching to increase the depth of the trenches causes the trenches to widen at a point below the first liner.

3. The method of claim 1, wherein etching to increase the depth of the trenches causes the trenches to have a vertical sidewall that extends from the first liner.

4. The method of claim 1, wherein filling the trenches comprises lining the trenches with a dielectric and then filling the trenches with metal.

5. The method of claim 1, wherein the trenches are deeper at intersections between segments.

6. A method, comprising:

forming a mask on a first side of a semiconductor substrate, wherein the mask defines a grid of openings that surround photodetector pixel regions of the semiconductor substrate;

etching the semiconductor substrate through the openings to form trenches to a first depth segment, wherein the trenches are defined by sidewalls of the semiconductor substrate;

lining the sidewalls with an etch-resistant coating;

adding additional depth segments to the trenches by repeating, for at least two additional cycles, (i) etching to break through the etch-resistant coating at bottoms of the trenches and to extend the trenches with a next depth segment while the etch-resistant coating remains along sidewalls of the trenches, and (ii) re-lining the sidewalls with the etch-resistant coating; and after reaching a target trench depth, removing residual etch-resistant coating from the trenches and filling the trenches to provide an isolation structure that extends between the photodetector pixel regions.

7. The method of claim 6, wherein a bottom of the first depth segment has a rate of narrowing with respect to increasing depth that is higher than a rate of narrowing with respect to increasing depth of a top of the next depth segment.

8. The method of claim 6, wherein vertical profiles of the first depth segment and the additional depth segments have bulges.

9. The method of claim 8, wherein the bulge in the first depth segment is wider than the bulges in the additional depth segments.

10. The method of claim 6, wherein one of the depth segments has a profile including an upper portion that widens with increasing depth and a lower portion that narrows with increasing depth.

11. The method of claim 6, wherein one of the depth segments has a profile including an upper half that that has constant width and a lower portion that narrows with increasing depth.

12. The method of claim 6, wherein the additional depth segments become progressively shorter with respect to order of formation.

13. The method of claim 6, wherein filling the trenches to provide an isolation structure that extends between the photodetector pixel regions comprises:

lining the trenches with dielectric; and filling the trenches with conductive material.

14. A method, comprising:

doping a semiconductor substrate from a first side to form an array of photodiodes within the semiconductor substrate;

thinning the semiconductor substrate from a second side, which is opposite the first side;

forming a mask on the second side, wherein the mask has openings with segments aligned to areas of the semiconductor substrate between the photodiodes;

plasma etching the semiconductor substrate through the openings to form trenches having bottoms and sidewalls, wherein the semiconductor substrate provides the bottoms and sidewalls; and cyclically repeating for at least two cycles a process comprising:

depositing a coating on the sidewalls of the trenches;

etching to break through the coating at the bottoms of the trenches; and plasma etching to deepen the trenches.

15. The method of claim 14, wherein the bottoms of the trenches are rounded.

16. The method of claim 14, wherein plasma etching uses a sufficiently low power and pressure that the etch rate is below 2 μm/min.

17. The method of claim 14, wherein plasma etching uses a pressure in the range from 3 to 30 millitorr.

18. The method of claim 14, wherein the coating has a thickness of at least 7 nm on the sidewalls of the trenches.

19. The method of claim 14, wherein depositing the coating and plasma etching take place at alternate times, but in the same tool.

20. The method of claim 14, wherein each successive cycle deepens the trenches by a lesser amount.

* * * * *